(12) United States Patent
Tsai et al.

(10) Patent No.: US 10,469,204 B2
(45) Date of Patent: Nov. 5, 2019

(54) TECHNIQUES OF CSI FEEDBACK WITH UNEQUAL ERROR PROTECTION MESSAGES

(71) Applicant: Mediatek Inc., Hsin-Chu (TW)

(72) Inventors: Lung-Sheng Tsai, Hsinchu (TW); Weidong Yang, San Jose, CA (US)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/865,457

(22) Filed: Jan. 9, 2018

(65) Prior Publication Data

US 2018/0198561 A1 Jul. 12, 2018

Related U.S. Application Data

(60) Provisional application No. 62/443,848, filed on Jan. 9, 2017, provisional application No. 62/540,085, filed on Aug. 2, 2017.

(51) Int. Cl.
*H04L 1/00* (2006.01)
*H03M 13/35* (2006.01)
(Continued)

(52) U.S. Cl.
CPC .......... *H04L 1/0073* (2013.01); *H03M 13/13* (2013.01); *H03M 13/136* (2013.01); *H03M 13/356* (2013.01); *H04B 7/0626* (2013.01); *H04B 7/0652* (2013.01); *H04L 1/007* (2013.01); *H04L 1/0013* (2013.01); *H04L 5/0057* (2013.01);
(Continued)

(58) Field of Classification Search
CPC ... H04L 1/0073; H04L 1/0013; H04L 1/1812; H03M 13/13; H03M 13/136; H03M 13/356; H04B 7/0652; H04B 7/0626; H04B 7/0478; H04B 7/0417; Y02D 70/26;
(Continued)

(56) References Cited

U.S. PATENT DOCUMENTS

2009/0016425 A1  1/2009 Hui et al.
2012/0314613 A1* 12/2012 Zhang ................. H04B 7/0486
                                                     370/252
(Continued)

FOREIGN PATENT DOCUMENTS

CN  102378254 A  3/2012
CN  103107866 A  5/2013
WO  2009057824 A1  5/2009

OTHER PUBLICATIONS

3GPP TSG RAN WG1 Meeting #64, Taipei, Taiwan (Year: 2011).*
International Search Report of PCT/CN2018/071938, dated Jan. 9, 2018.
Taiwan Patent Office, "Office Action", dated Feb. 27, 2019, Taiwan.
Taiwan Patent Office, "Office Action", dated May 9, 2019, Taiwan.

*Primary Examiner* — Dady Chery
(74) *Attorney, Agent, or Firm* — Locke Lord LLP; Tim Tingkang Xia, Esq.

(57) ABSTRACT

In an aspect of the disclosure, a method, a computer-readable medium, and an apparatus are provided. The apparatus may be a UE. The UE determines a plurality of messages containing channel state information to be reported to a base station. The UE also determines a priority level for each of the plurality of messages based on at least one predetermined rule. The UE further selects one or more messages from the plurality of messages based on priority levels of the plurality of messages. The UE then sends the selected one or more messages to the base station.

32 Claims, 15 Drawing Sheets

(51) Int. Cl.

| | | |
|---|---|---|
| *H04B 7/06* | (2006.01) | |
| *H03M 13/13* | (2006.01) | |
| *H04L 27/34* | (2006.01) | |
| *H04L 5/00* | (2006.01) | |
| *H04B 7/0417* | (2017.01) | |
| *H04L 1/18* | (2006.01) | |
| *H04B 7/0456* | (2017.01) | |

(52) U.S. Cl.
 CPC ........ *H04L 5/0064* (2013.01); *H04L 27/3488* (2013.01); *H04B 7/0417* (2013.01); *H04B 7/0478* (2013.01); *H04L 1/1812* (2013.01); *Y02D 70/1242* (2018.01); *Y02D 70/1262* (2018.01); *Y02D 70/142* (2018.01); *Y02D 70/21* (2018.01); *Y02D 70/26* (2018.01)

(58) Field of Classification Search
 CPC .. Y02D 70/21; Y02D 70/142; Y02D 70/1242; Y02D 70/1262
 See application file for complete search history.

(56) References Cited

U.S. PATENT DOCUMENTS

| | | |
|---|---|---|
| 2013/0028182 A1 | 1/2013 | Geirhofer et al. |
| 2013/0117622 A1 | 5/2013 | Blankenship et al. |
| 2016/0182187 A1 | 6/2016 | Kim et al. |
| 2017/0353267 A1* | 12/2017 | Kudekar ............... H04L 1/0045 |

\* cited by examiner

TECHNIQUES OF CSI FEEDBACK WITH UNEQUAL ERROR PROTECTION MESSAGES

CROSS-REFERENCE TO RELATED APPLICATION(S)

This application claims the benefit of U.S. Provisional Application Ser. No. 62/443,848, entitled "CSI FEEDBACK WITH UNEQUAL ERROR PROTECTION MESSAGES" and filed on Jan. 9, 2017, and U.S. Provisional Application Ser. No. 62/540,085, entitled "CSI FEEDBACK WITH UNEQUAL ERROR PROTECTION MESSAGES" and filed on Aug. 2, 2017, which are expressly incorporated by reference herein in their entirety.

BACKGROUND

Field

The present disclosure relates generally to communication systems, and more particularly, to user equipment (UE) that reports channel state information to a base station with unequal error protection messages.

Background

The statements in this section merely provide background information related to the present disclosure and may not constitute prior art.

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may be a UE. The UE determines a plurality of messages containing channel state information to be reported to a base station. The UE also determines a priority level for each of the plurality of messages based on at least one predetermined rule. The UE further selects one or more messages from the plurality of messages based on priority levels of the plurality of messages. The UE then sends the selected one or more messages to the base station.

In another aspect, the UE determines a first message and a second message containing channel state information to be reported to a base station. The UE also determines that a priority level of the first message is higher than a priority level of the second message based on at least one predetermined rule. The UE further maps information bits of the first message to a first plurality of input bits of an encoder and information bits of the second message to a second plurality of input bits of the encoder. The first plurality of input bits offer an error protection level higher than an error protection level offered by the second plurality of input bits.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
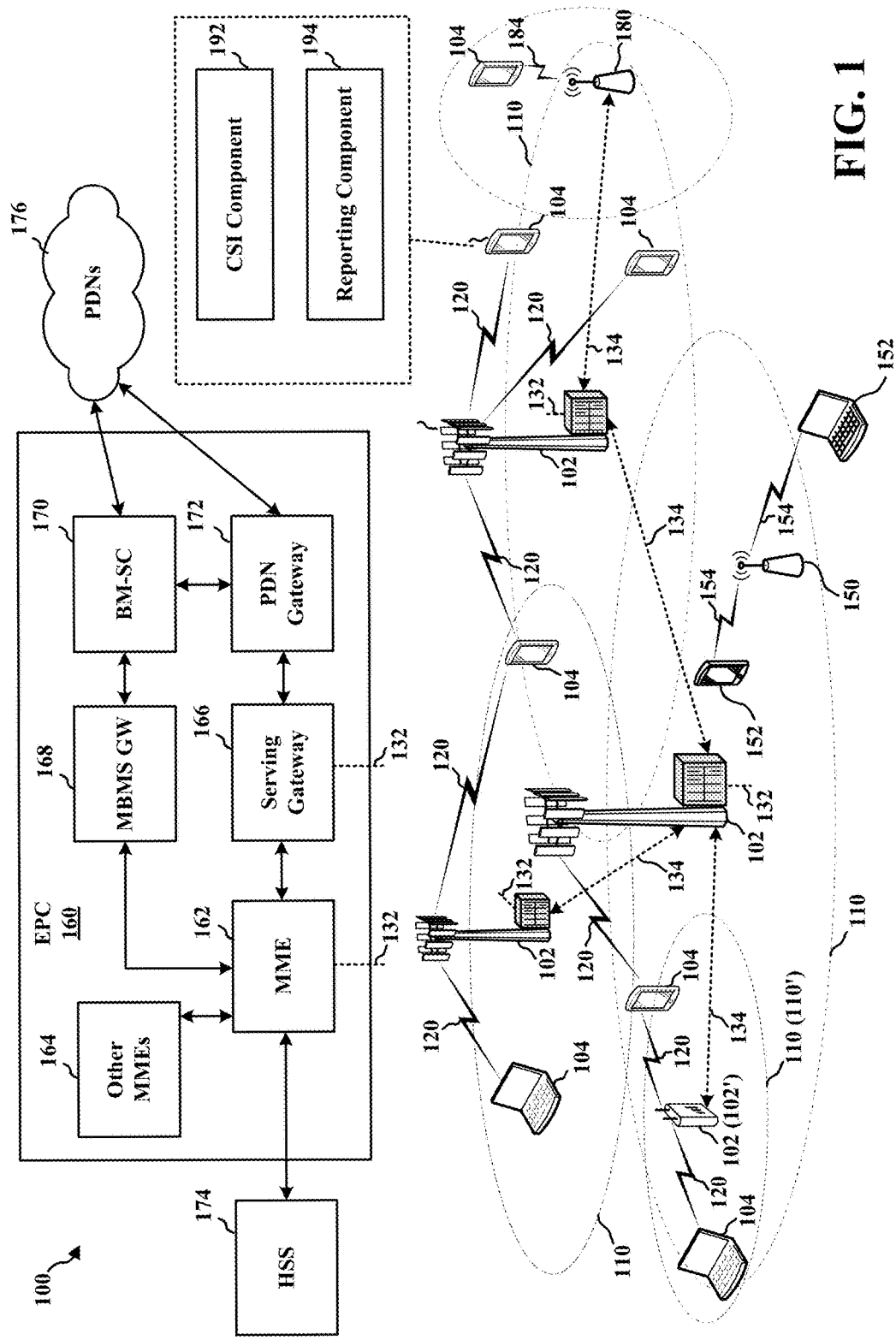
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, and an Evolved Packet Core (EPC) 160. The base stations 102 may include macro cells (high power cellular base station) and/or small cells (low power cellular base station). The macro cells include base stations. The small cells include femtocells, picocells, and microcells.

The base stations 102 (collectively referred to as Evolved Universal Mobile Telecommunications System (UMTS) Terrestrial Radio Access Network (E-UTRAN)) interface with the EPC 160 through backhaul links 132 (e.g., S1 interface). In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macro cells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100 MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

The gNodeB (gNB) 180 may operate in millimeter wave (mmW) frequencies and/or near mmW frequencies in communication with the UE 104. When the gNB 180 operates in mmW or near mmW frequencies, the gNB 180 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 180 may utilize beamforming 184 with the UE 104 to compensate for the extremely high path loss and short range.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service (PSS), and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The base station may also be referred to as a gNB, Node B, evolved Node B (eNB), an access point, a base transceiver station, a radio base station, a radio transceiver, a transceiver function, a basic service set (BSS), an extended service set (ESS), or some other suitable terminology. The base station 102 provides an access point to the EPC 160 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a toaster, or any other similar functioning device. Some of the UEs 104 may be referred to as IoT devices (e.g., parking meter, gas pump, toaster, vehicles, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

In certain aspects, the UE 104 determines, via a CSI component 192, a plurality of messages containing channel state information to be reported to a base station. The UE 104 also determines, via a reporting module 194, a priority level for each of the plurality of messages based on at least one predetermined rule. The UE 104 further selects one or more messages from the plurality of messages based on priority levels of the plurality of messages. The UE 104 then sends the selected one or more messages to the base station.

In certain aspects, the UE 104 determines, via the CSI component 192, a first message and a second message containing channel state information to be reported to a base station. The UE 104 also determines, via the reporting module 194, that a priority level of the first message is higher than a priority level of the second message based on at least one predetermined rule. The UE 104 further maps information bits of the first message to a first plurality of input bits of an encoder and information bits of the second message to a second plurality of input bits of the encoder. The first plurality of input bits offer an error protection level higher than an error protection level offered by the second plurality of input bits.

Figure 2:
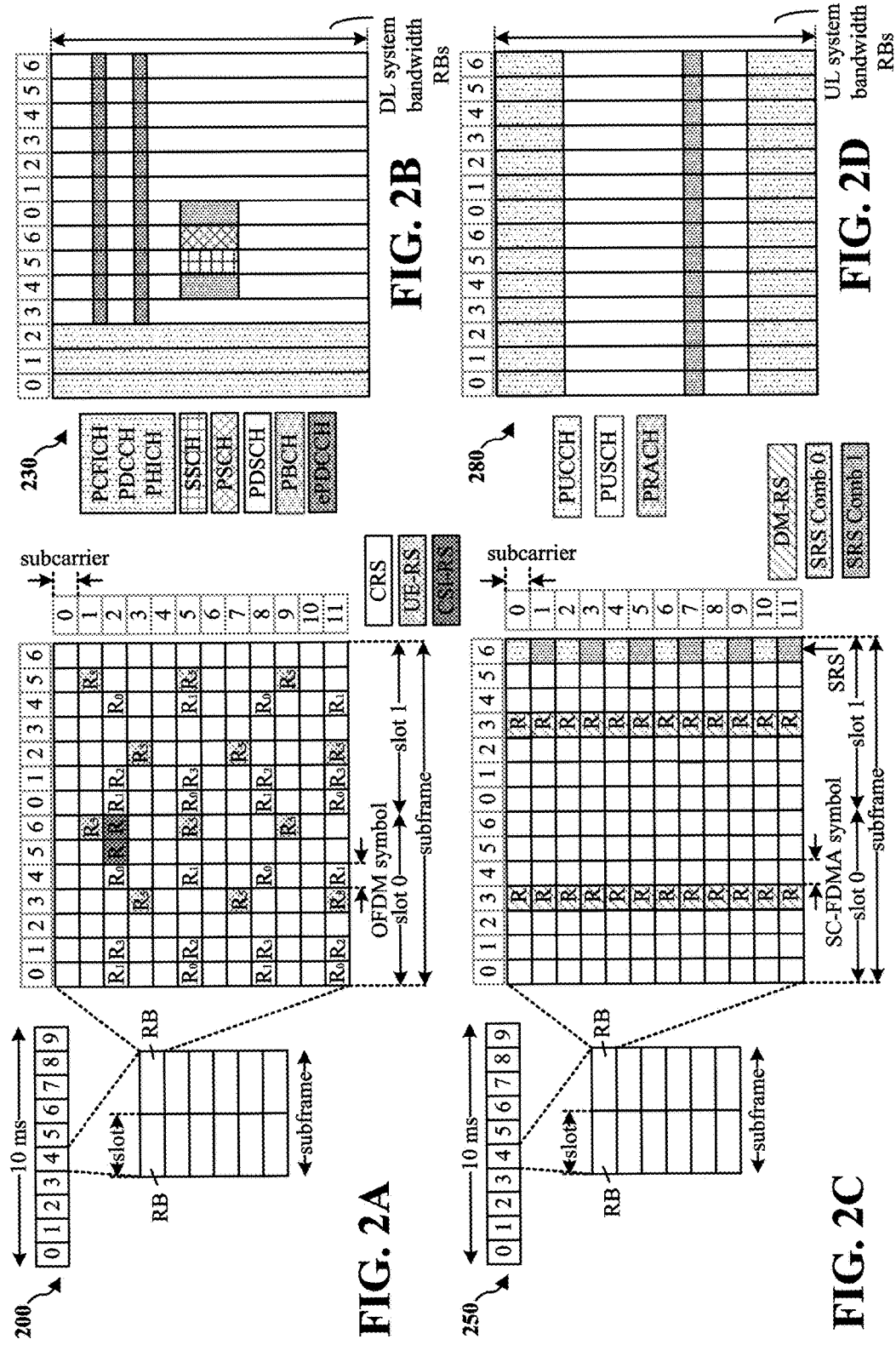
FIGS. 2A, 2B, 2C, and 2D are diagrams illustrating examples of a DL frame structure, DL channels within the DL frame structure, an UL frame structure, and UL channels within the UL frame structure, respectively.

FIG. 2A is a diagram 200 illustrating an example of a DL frame structure. FIG. 2B is a diagram 230 illustrating an example of channels within the DL frame structure. FIG. 2C is a diagram 250 illustrating an example of an UL frame structure. FIG. 2D is a diagram 280 illustrating an example of channels within the UL frame structure. Other wireless communication technologies may have a different frame structure and/or different channels. A frame (10 ms) may be divided into 10 equally sized subframes. Each subframe may include two consecutive time slots. A resource grid may be used to represent the two time slots, each time slot including one or more time concurrent resource blocks (RBs) (also referred to as physical RBs (PRBs)). The resource grid is divided into multiple resource elements (REs). For a normal cyclic prefix, an RB contains 12 consecutive subcarriers in the frequency domain and 7 consecutive symbols (for DL, OFDM symbols; for UL, SC-FDMA symbols) in the time domain, for a total of 84 REs. For an extended cyclic prefix, an RB contains 12 consecutive subcarriers in the frequency domain and 6 consecutive symbols in the time domain, for a total of 72 REs. The number of bits carried by each RE depends on the modulation scheme.

As illustrated in FIG. 2A, some of the REs carry DL reference (pilot) signals (DL-RS) for channel estimation at the UE. The DL-RS may include cell-specific reference signals (CRS) (also sometimes called common RS), UE-specific reference signals (UE-RS), and channel state information reference signals (CSI-RS). FIG. 2A illustrates CRS for antenna ports 0, 1, 2, and 3 (indicated as R0, R1, R2, and R3, respectively), UE-RS for antenna port 5 (indicated as R5), and CSI-RS for antenna port 15 (indicated as R). FIG. 2B illustrates an example of various channels within a DL subframe of a frame. The physical control format indicator channel (PCFICH) is within symbol 0 of slot 0, and carries a control format indicator (CFI) that indicates whether the physical downlink control channel (PDCCH) occupies 1, 2, or 3 symbols (FIG. 2B illustrates a PDCCH that occupies 3 symbols). The PDCCH carries downlink control information (DCI) within one or more control channel elements (CCEs), each CCE including nine RE groups (REGs), each REG including four consecutive REs in an OFDM symbol. A UE may be configured with a UE-specific enhanced PDCCH (ePDCCH) that also carries DCI. The ePDCCH may have 2, 4, or 8 RB pairs (FIG. 2B shows two RB pairs, each subset including one RB pair). The physical hybrid automatic repeat request (ARQ) (HARQ) indicator channel (PHICH) is also within symbol 0 of slot 0 and carries the HARQ indicator (HI) that indicates HARQ acknowledgement (ACK)/negative ACK (NACK) feedback based on the physical uplink shared channel (PUSCH). The primary synchronization channel (PSCH) may be within symbol 6 of slot 0 within subframes 0 and 5 of a frame. The PSCH carries a primary synchronization signal (PSS) that is used by a UE to determine subframe/symbol timing and a physical layer identity. The secondary synchronization channel (SSCH) may be within symbol 5 of slot 0 within subframes 0 and 5 of a frame. The SSCH carries a secondary synchronization signal (SSS) that is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DL-RS. The physical broadcast channel (PBCH), which carries a master information block (MIB), may be logically grouped with the PSCH and SSCH to form a synchronization signal (SS) block. The MIB provides a number of RBs in the DL system bandwidth, a PHICH configuration, and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry demodulation reference signals (DM-RS) for channel estimation at the base station. The UE may additionally transmit sounding reference signals (SRS) in the last symbol of a subframe. The SRS may have a comb structure, and a UE may transmit SRS on one of the combs. The SRS may be used by a base station for channel quality estimation to enable frequency-dependent scheduling on the UL. FIG. 2D illustrates an example of various channels within an UL subframe of a frame. A physical random access channel (PRACH) may be within one or more subframes within a frame based on the PRACH configuration. The PRACH may include six consecutive RB pairs within a subframe. The PRACH allows the UE to perform initial system access and achieve UL synchronization. A physical uplink control channel (PUCCH) may be located on edges of the UL system bandwidth. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
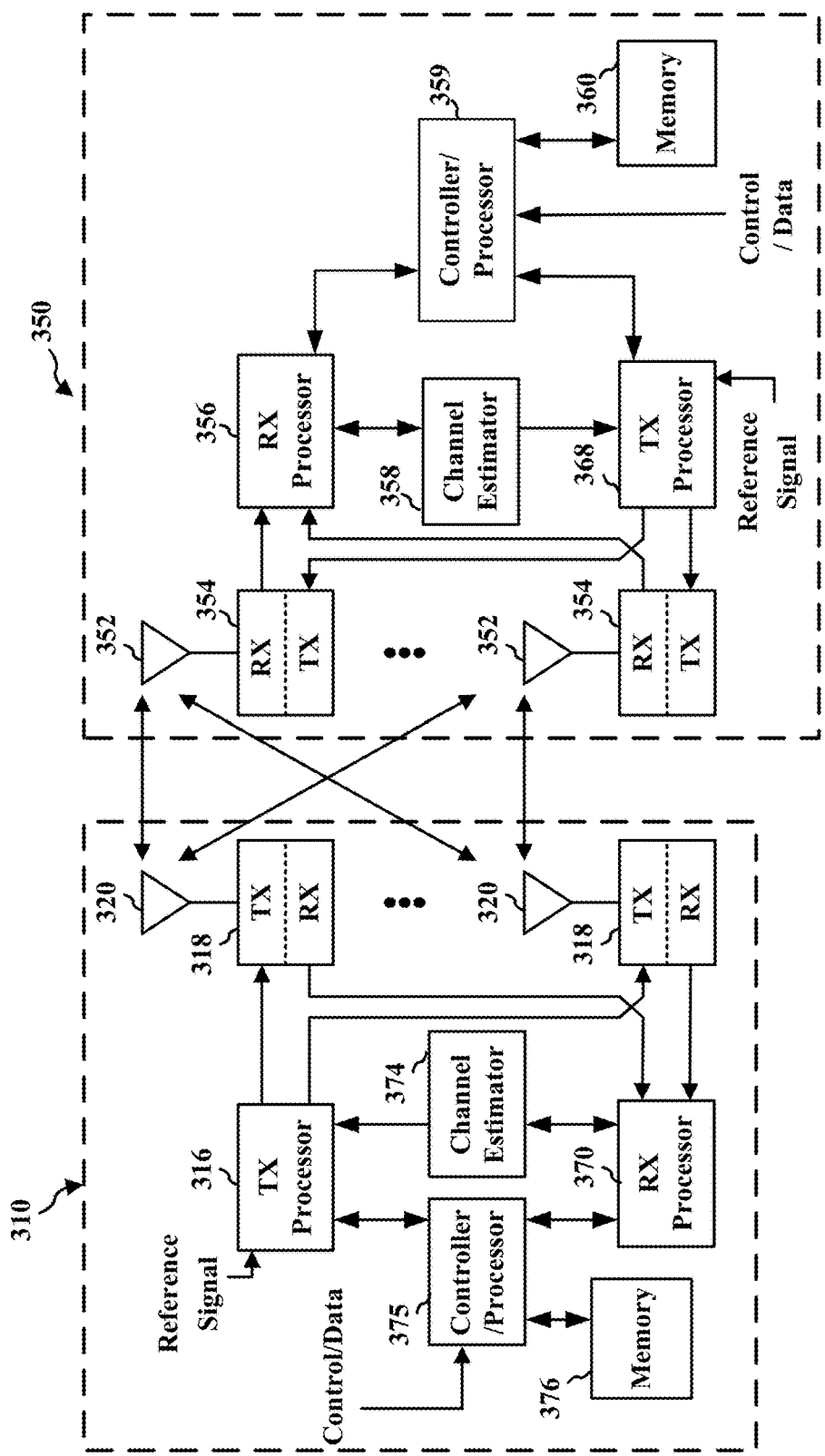
FIG. 3 is a diagram illustrating a base station in communication with a UE in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission. The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

New radio (NR) may refer to radios configured to operate according to a new air interface (e.g., other than Orthogonal Frequency Divisional Multiple Access (OFDMA)-based air interfaces) or fixed transport layer (e.g., other than Internet Protocol (IP)). NR may utilize OFDM with a cyclic prefix (CP) on the uplink and downlink and may include support for half-duplex operation using time division duplexing (TDD). NR may include Enhanced Mobile Broadband (eMBB) service targeting wide bandwidth (e.g. 80 MHz beyond), millimeter wave (mmW) targeting high carrier frequency (e.g. 60 GHz), massive MTC (mMTC) targeting non-backward compatible MTC techniques, and/or mission critical targeting ultra-reliable low latency communications (URLLC) service.

A single component carrier bandwidth of 100 MHZ may be supported. In one example, NR resource blocks (RBs) may span 12 sub-carriers with a sub-carrier bandwidth of 75 kHz over a 0.1 ms duration or a bandwidth of 15 kHz over a 1 ms duration. Each radio frame may consist of 10 or 50 subframes with a length of 10 ms. Each subframe may have a length of 0.2 ms. Each subframe may indicate a link direction (i.e., DL or UL) for data transmission and the link direction for each subframe may be dynamically switched. Each subframe may include DL/UL data as well as DL/UL control data. UL and DL subframes for NR may be as described in more detail below with respect to FIGS. 6 and 7.

Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based interface.

The NR RAN may include a central unit (CU) and distributed units (DUs). A NR BS (e.g., gNB, 5G Node B, Node B, transmission reception point (TRP), access point (AP)) may correspond to one or multiple BSs. NR cells can be configured as access cells (ACells) or data only cells (DCells). For example, the RAN (e.g., a central unit or distributed unit) can configure the cells. DCells may be cells used for carrier aggregation or dual connectivity and may not be used for initial access, cell selection/reselection, or handover. In some cases DCells may not transmit synchronization signals (SS) in some cases DCells may transmit SS. NR BSs may transmit downlink signals to UEs indicating the cell type. Based on the cell type indication, the UE may communicate with the NR BS. For example, the UE may determine NR BSs to consider for cell selection, access, handover, and/or measurement based on the indicated cell type.

Figure 4:
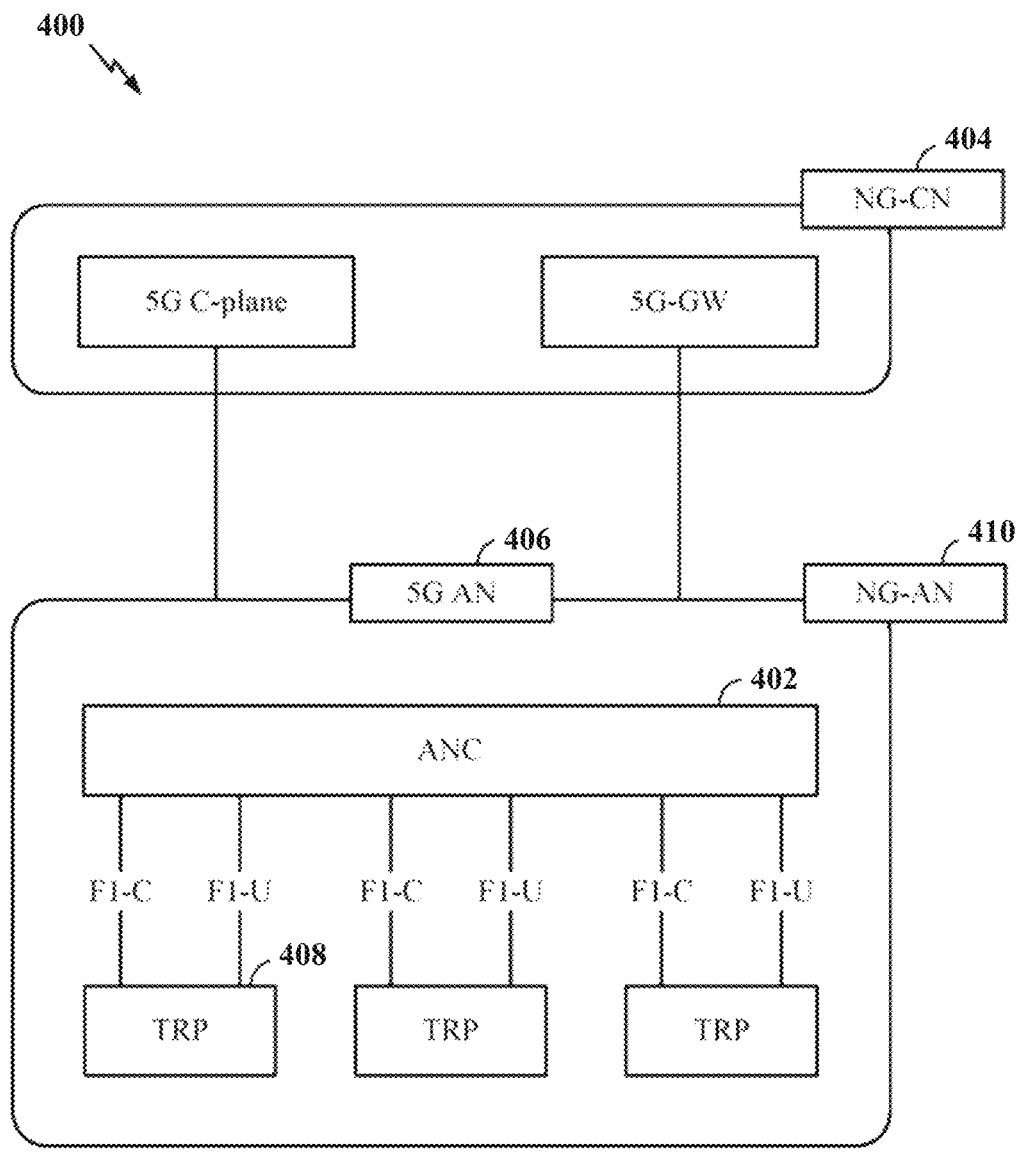
FIG. 4 illustrates an example logical architecture of a distributed access network.

FIG. 4 illustrates an example logical architecture 400 of a distributed RAN, according to aspects of the present disclosure. A 5G access node 406 may include an access node controller (ANC) 402. The ANC may be a central unit (CU) of the distributed RAN 400. The backhaul interface to the next generation core network (NG-CN) 404 may terminate at the ANC. The backhaul interface to neighboring next generation access nodes (NG-ANs) may terminate at the ANC. The ANC may include one or more TRPs 408 (which may also be referred to as BSs, NR BSs, Node Bs, 5G NBs, APs, or some other term). As described above, a TRP may be used interchangeably with "cell."

The TRPs 408 may be a distributed unit (DU). The TRPs may be connected to one ANC (ANC 402) or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (e.g., dynamic selection) or jointly (e.g., joint transmission) serve traffic to a UE.

The local architecture of the distributed RAN 400 may be used to illustrate fronthaul definition. The architecture may be defined that support fronthauling solutions across different deployment types. For example, the architecture may be based on transmit network capabilities (e.g., bandwidth, latency, and/or jitter). The architecture may share features and/or components with LTE. According to aspects, the next generation AN (NG-AN) 410 may support dual connectivity with NR. The NG-AN may share a common fronthaul for LTE and NR.

The architecture may enable cooperation between and among TRPs 408. For example, cooperation may be preset within a TRP and/or across TRPs via the ANC 402. According to aspects, no inter-TRP interface may be needed/present.

According to aspects, a dynamic configuration of split logical functions may be present within the architecture of the distributed RAN 400. The PDCP, RLC, MAC protocol may be adaptably placed at the ANC or TRP.

Figure 5:
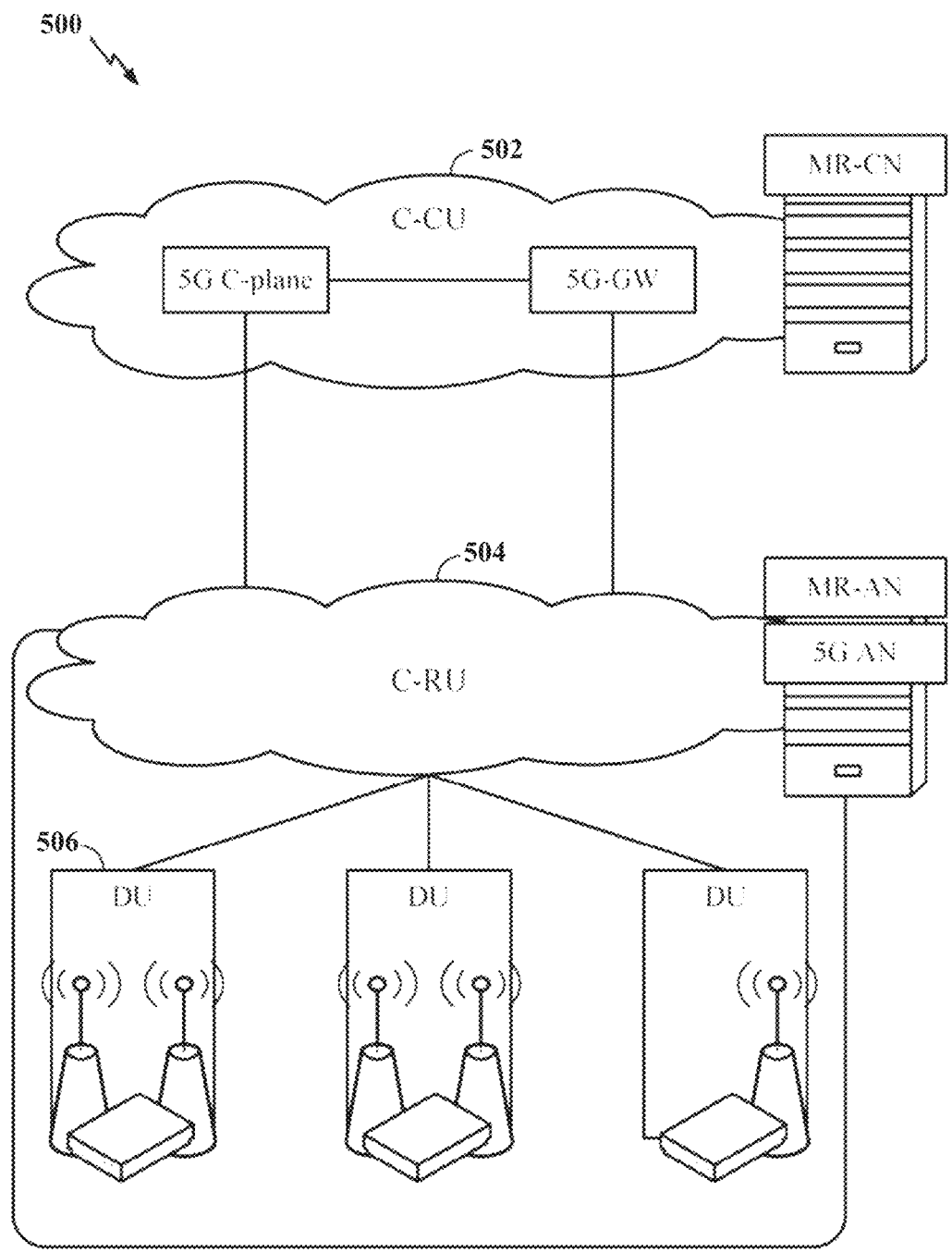
FIG. 5 illustrates an example physical architecture of a distributed access network.

FIG. 5 illustrates an example physical architecture of a distributed RAN 500, according to aspects of the present disclosure. A centralized core network unit (C-CU) 502 may host core network functions. The C-CU may be centrally deployed. C-CU functionality may be offloaded (e.g., to advanced wireless services (AWS)), in an effort to handle peak capacity. A centralized RAN unit (C-RU) 504 may host one or more ANC functions. Optionally, the C-RU may host core network functions locally. The C-RU may have distributed deployment. The C-RU may be closer to the network edge. A distributed unit (DU) 506 may host one or more TRPs. The DU may be located at edges of the network with radio frequency (RF) functionality.

Figure 6:
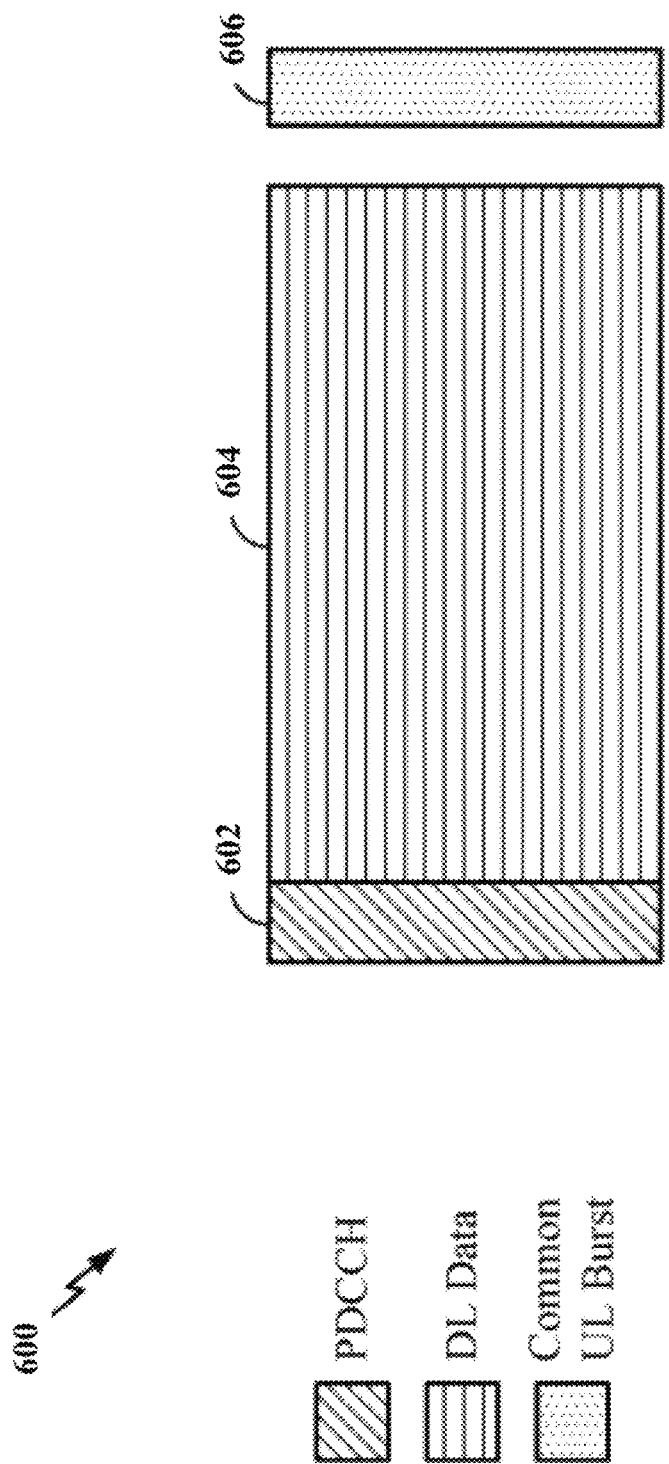
FIG. 6 is a diagram showing an example of a DL-centric subframe.

FIG. 6 is a diagram 600 showing an example of a DL-centric subframe. The DL-centric subframe may include a control portion 602. The control portion 602 may exist in the initial or beginning portion of the DL-centric subframe. The control portion 602 may include various scheduling information and/or control information corresponding to various portions of the DL-centric subframe. In some configurations, the control portion 602 may be a physical DL control channel (PDCCH), as indicated in FIG. 6. The DL-centric subframe may also include a DL data portion 604. The DL data portion 604 may sometimes be referred to as the payload of the DL-centric subframe. The DL data portion 604 may include the communication resources utilized to communicate DL data from the scheduling entity (e.g., UE or BS) to the subordinate entity (e.g., UE). In some configurations, the DL data portion 604 may be a physical DL shared channel (PDSCH).

The DL-centric subframe may also include a common UL portion 606. The common UL portion 606 may sometimes be referred to as an UL burst, a common UL burst, and/or various other suitable terms. The common UL portion 606 may include feedback information corresponding to various other portions of the DL-centric subframe. For example, the common UL portion 606 may include feedback information corresponding to the control portion 602. Non-limiting examples of feedback information may include an ACK signal, a NACK signal, a HARQ indicator, and/or various other suitable types of information. The common UL portion 606 may include additional or alternative information, such as information pertaining to random access channel (RACH) procedures, scheduling requests (SRs), and various other suitable types of information.

As illustrated in FIG. 6, the end of the DL data portion 604 may be separated in time from the beginning of the common UL portion 606. This time separation may sometimes be referred to as a gap, a guard period, a guard interval, and/or various other suitable terms. This separation provides time for the switch-over from DL communication (e.g., reception operation by the subordinate entity (e.g., UE)) to UL communication (e.g., transmission by the subordinate entity (e.g., UE)). One of ordinary skill in the art will understand that the foregoing is merely one example of a DL-centric subframe and alternative structures having similar features may exist without necessarily deviating from the aspects described herein.

Figure 7:
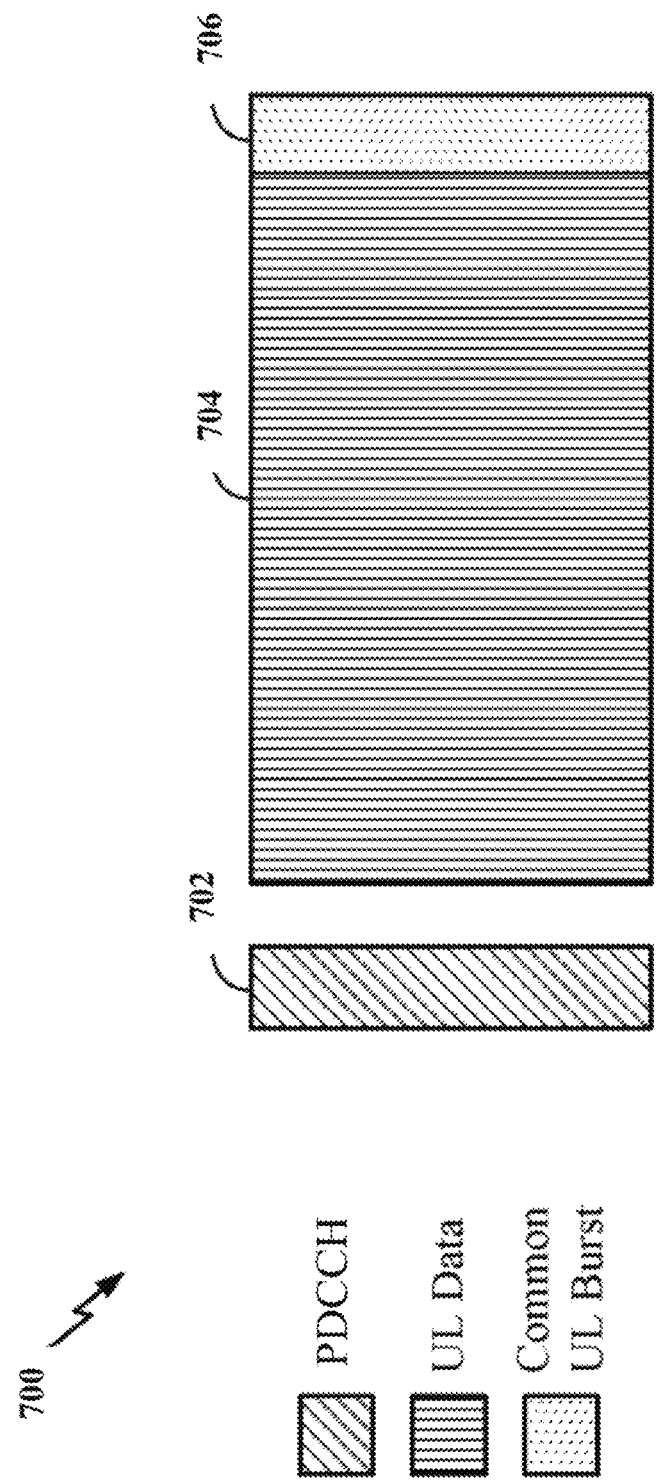
FIG. 7 is a diagram showing an example of an UL-centric subframe.

FIG. 7 is a diagram 700 showing an example of an UL-centric subframe. The UL-centric subframe may include a control portion 702. The control portion 702 may exist in the initial or beginning portion of the UL-centric subframe. The control portion 702 in FIG. 7 may be similar to the control portion 602 described above with reference to FIG. 6. The UL-centric subframe may also include an UL data portion 704. The UL data portion 704 may sometimes be referred to as the pay load of the UL-centric subframe. The UL portion may refer to the communication resources utilized to communicate UL data from the subordinate entity (e.g., UE) to the scheduling entity (e.g., UE or BS). In some configurations, the control portion 702 may be a physical DL control channel (PDCCH)

As illustrated in FIG. 7, the end of the control portion 702 may be separated in time from the beginning of the UL data portion 704. This time separation may sometimes be referred to as a gap, guard period, guard interval, and/or various other suitable terms. This separation provides time for the switch-over from DL communication (e.g., reception operation by the scheduling entity) to UL communication (e.g., transmission by the scheduling entity). The UL-centric subframe may also include a common UL portion 706. The common UL portion 706 in FIG. 7 may be similar to the common UL portion 706 described above with reference to FIG. 7. The common UL portion 706 may additionally or alternatively include information pertaining to channel quality indicator (CQI), sounding reference signals (SRSs), and various other suitable types of information. One of ordinary skill in the art will understand that the foregoing is merely one example of an UL-centric subframe and alternative structures having similar features may exist without necessarily deviating from the aspects described herein.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum)

The present disclosure introduces methods to multiplex messages to provide unequal error protection (UEP) features, and presents candidate messages suitable for UEP multiplexing in communication systems. Multiplexing multiple messages together to be sent from a UE to a base station for encoding is beneficial for efficient transmission, because under the same code rate, the reliability becomes higher as the whole code length increases. UEP offers different protection levels (reliabilities) for different messages. In certain situations when not all multiplexed messages can be correctly recovered at receiver, UEP can recover at least a part of the multiplexed messages, which may be used to carry important/critical data. Such situations can happen when channel quality is not stable and difficult to predict, especially for high-speed moving terminals. In certain configurations, a system can use a conservative low-rate channel code to increase the success rate of decoding all multiplexed messages at the receiver. In certain configurations, a system can employ UEP multiplexing to achieve a greater success rate of recovering a part (but not all) of the multiplexed messages with less cost on either power consumption or increased spectral efficiency.

In communication systems, there are many scenarios where information messages are not equally important. For example, in LTE, feedback of channel state information (CSI) measured by a terminal may contain rank-indicator (RI), channel quality indicator (CQI), and precoding matrix indicator (PMI). Among the three indicators, RI is the most important and is sent though feedback channel with lowest code-rate.

In 3GPP LTE Release 10, a dual codebook structure was introduced and it supports a CSI reporting mechanism with first PMI i1 and second PMI i2. Conceptually, i1 is used to select a set of beam directions, and i2 further indicates which beam is selected and how to perform co-phasing combining for spatial signals transmitted by two array partitions of entire transmitter antenna array. This dual codebook structure may be further generalized to allow representation of a precoding vector by a linear combination of basis vectors. The second PMI i2 may be further used to indicate how to perform the linear combination on the beam directions indicated by first PMI i1 in addition to beam selection as specified Rel-10. Due to the dependency between the two PMIs i1 and i2, the first PMI i1 may be treated as more important than the second PMI i2.

Another example is CSI report part 1 in NR Type II CSI. The part 1 report consists at least RI information and other components. Payload size of CSI report part 2 is a function of RI. Therefore, RI information may be treated as relatively more important to serve as a guideline for future resource allocation used to carry CSI reports.

Figure 8:
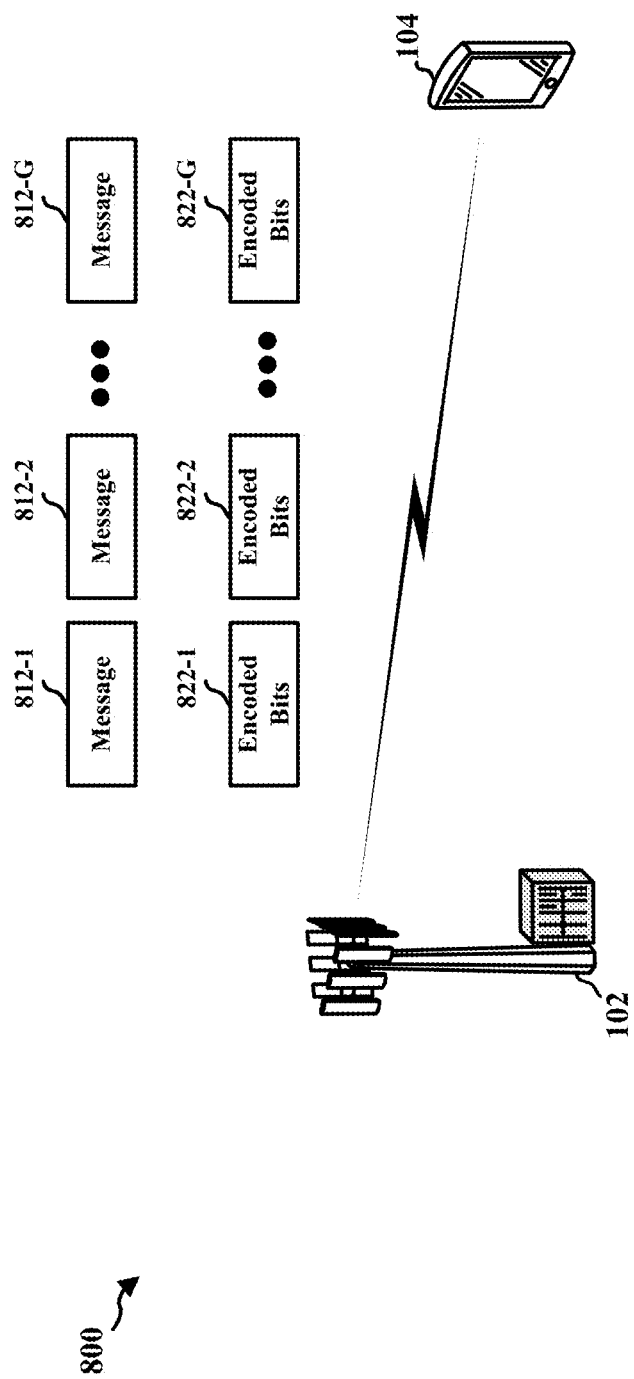
FIG. 8 is a diagram illustrating communications between a base station and UE.

FIG. 8 is a diagram 800 illustrating communication between a base station 102 and UE 104. The UE 104 may have messages 812-1, 812-2, . . . 812-G, whose priority levels are decreasing, to be transmitted to the UE 104, G being an integer greater than 1. As described infra, the UE 104 may determine priority levels of the messages 812-1, 812-2, . . . 812-G based on one or more predetermined rules. In this example, the message 812-1 is assigned the highest priority level and is to be transmitted with the highest error protection level.

The UE 104 is configured to use encoded bits 822-1, 822-2, . . . 822-G having different reliabilities to carry the messages 812-1, 812-2, . . . 812-G, which have different priority levels. In this example, the UE 104 may use the encoded bits 822-1, which have the highest priority level, to carry the message 812-1, and may use the encoded bits 822-G, which have the lowest reliability, to carry the message 812-G.

As described infra, the UE 104 is configured to map information bits of each of the messages 812-1, 812-2, . . . 812-G to respective encoded bits 822-1, 822-2, . . . 822-G according to predetermined rules. For example, information bits representing the message 812-i can be directly mapped to encoded bits 822-i, i being an integer greater than 0. Further, the information bits of the message 812-i can be encoded with error correction/detection codes to form encoded bits 822-i.

In a first configuration, the UE 104 is configured to multiplex the messages 812-1, 812-2, . . . 812-G with a predetermined channel code such as Polar code and Reed-Muller code. In information theory, a Polar code is a linear block error correcting code. The code construction is based on a multiple recursive concatenation of a short kernel code which transforms the physical channel into virtual outer channels. When the number of recursions becomes large, the virtual channels tend to either have high reliability or low reliability (in other words, they polarize), and the data bits can be allocated to the most reliable channels.

Figure 9:
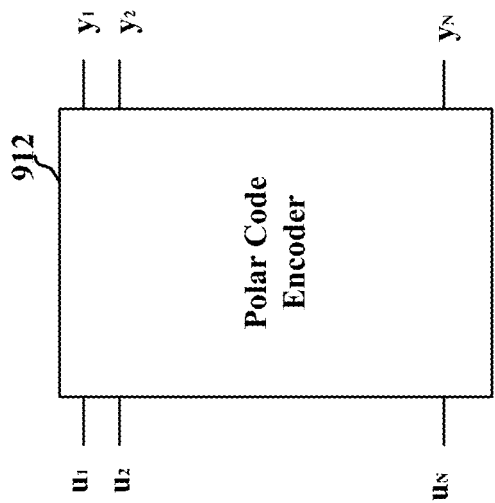
FIG. 9 is diagram illustrating a Polar code encoder 912 that may be employed by the UE.

FIG. 9 is diagram 900 illustrating a Polar code encoder 912 that may be employed by the UE 104. In this example, the Polar code encoder 912 receives N input bits $\{u_1, u_2, \ldots, u_N\}$, N being an integer greater than 1. Based on the N input bits $\{u_1, u_2, \ldots, u_N\}$, the Polar code encoder 912 generates N output encoded bits $\{y_1, y_2, \ldots, y_N\}$. To construct a Polar code with code-rate R=K/N, where K and N denote the number of information bits to be encoded and the number of encoded bits respectively. The UE 104 can select K positions from the N input bits $\{u_1, u_2, \ldots, u_N\}$ to receive K information bits. The rest (N−K) bits of the N input bits $\{u_1, u_2, \ldots, u_N\}$ are so-called frozen bits, which are predefined and do not carry any information bit. As described supra, the N output encoded bits $\{y_1, y_2, \ldots, y_N\}$ generated by the Polar code encoder 912 can have polarized reliability. In other words, some bits of the N input bits $\{u_1, u_2, \ldots, u_N\}$ can be reliably decoded at the receiver, while some other bits of the N input bits $\{u_1, u_2, \ldots, u_N\}$ are not equally reliable.

In a broader sense, the most reliable bits of the N input bits $\{u_1, u_2, \ldots, u_N\}$ are either those input bits with the lowest indices (e.g., $u_1, u_2, \ldots$) or those input bits with the highest indices (e.g., $u_N, u_{N-1}, \ldots$). In certain configurations, the reliability (or the protection level) of each input bit of the N input bits $\{u_1, u_2, \ldots, u_N\}$ can be approximately estimated by the mean log likelihood ratio (LLR) of each input bit, $E[L_N^{(i)}]$, where the operator E[.] denotes ensemble average or directly quantified by bit-error rate of each bit. The UE 104 can construct a good Polar code with rate R=K/N by selecting the K input bits from the N input bits $\{u_1, u_2, \ldots, u_N\}$ with the highest mean LLRs and setting the rest (N−K) input bits of the N input bits $\{u_1, u_2, \ldots, u_N\}$ as frozen bits. The information bits of the messages 812-1, 812-2, . . . 812-G are assigned to the input bits that are not frozen bits. Based on the positions/indices of the input bits used to carry a particular message, the UE 104 can estimate the block error rate of receiving the particular message. Accordingly, the UE 104 can select a group of input bits of the N input bits $\{u_1, u_2, \ldots, u_N\}$ that have the highest mean LLRs to carry the message 812-1, which has the highest priority level, and select a group of input bits of the N input bits $\{u_1, u_2, \ldots, u_N\}$ that have the next highest mean LLRs to carry the message 812-2, which has the next highest priority level, and so on.

In one example, the UE 104 may multiplex the message 812-1 carrying the first PMI i1 and the message 812-2 carrying the second PMI i2. Each of the message 812-1 and the message 812-2 may have 20 information bits and 16 cyclic redundancy check (CRC) bits. Further, the Polar code encoder 912 has 128 input bits. This, N is 128 for N input bits $\{u_1, u_2, \ldots, u_N\}$ described supra. The total number of bits for the message 812-1 and the message 812-2 are 72. Therefore, the code rate R is 72/128 (i.e., 0.5625). The UE 104 can calculate the mean LLR of each input bit of the N input bits $\{u_1, u_2, \ldots, u_N\}$. The UE 104 assigns the 36 bits of the message 812-1 to 36 input bits of the N input bits $\{u_1, u_2, \ldots, u_N\}$ with the $1^{st}$ to the $36^{th}$ highest $E[L_N^{(i)}]$. The UE 104 assigns the 36 bits of the message 812-2 to 36 input bits of the N input bits $\{u_1, u_2, \ldots, u_N\}$ with the $37^{th}$ to the $72^{th}$ highest $E[L_N^{(i)}]$. The remaining 56 input bits of the N input bits $\{u_1, u_2, \ldots, u_N\}$ are frozen bits. Accordingly, when the UE 104 transmits the N output encoded bits $\{y_1, y_2, \ldots, y_N\}$ generated by the Polar code encoder 912, the N output encoded bits $\{y_1, y_2, \ldots, y_N\}$ provide a higher level of protection to the message 812-1 carrying the first PMI i1 than the message 812-2 carrying the second PMI i2. In certain circumstances where the base station 102 can successfully decode the information bits of the message 812-1 but fails to decode the information bits of the message 812-2, the base station 102 can still use the first PMI it carried in the message 812-1 to determine transmission parameters without the second PMI i2 (e.g., precoder cycling based on the decoded first PMI).

Figure 10:
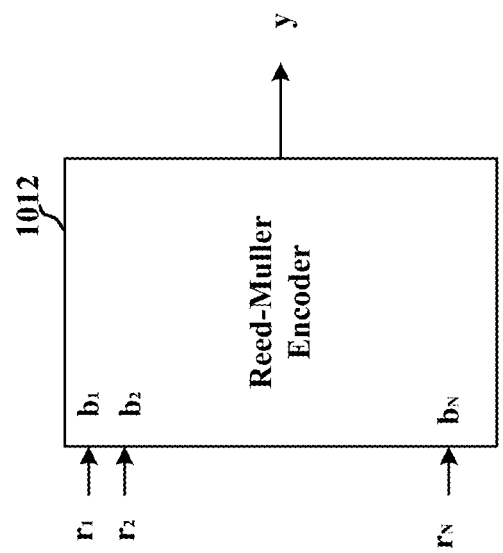
FIG. 10 is diagram illustrating a Reed-Muller code encoder 1012 that may be employed by the UE.

FIG. 10 is diagram 1000 illustrating a Reed-Muller code encoder 1012 that may be employed by the UE 104. In this example, the Reed-Muller code encoder 1012 utilizes N basis vectors $\{b_1, b_2, \ldots, b_N\}$. Further, the N basis vectors $\{b_1, b_2, \ldots, b_N\}$ can be arranged so that the bit-error-rate of each bit carried by each of the N basis vectors $\{b_1, b_2, \ldots, b_N\}$ is in an ascending order. One possible approach to approximately achieve the ordering is to satisfy $\min_{\forall j \neq 1} |b1-bj| \geq \min_{\forall j \neq 2} |b2-bj| \geq \ldots \geq \min_{\forall j \neq n} |bn-bj|$, where $|bx-by|$ denotes the Euclidean distance between two basis vectors bx and by. As such, the reliabilities of the N basis vectors $\{b_1, b_2, \ldots, b_N\}$ is in a descending order. The Reed-Muller code encoder 1012 has N input bits $\{r_1, r_2, \ldots, r_N\}$ corresponding to the N basis vectors $\{b_1, b_2, \ldots, b_N\}$, and generates encoded bits y. In one example, the message 812-1 has 36 bits carrying the first PMI i1 and the message 812-2 has 36 bits carrying the second PMI i2. As such, the 36 bits of the message 812-1 are mapped to the input bits $r_1$ to $r_{36}$ of the Reed-Muller code encoder 1012. The 36 bits of the message 812-2 are mapped to the input bits $r_{37}$ to $r_{72}$ of the Reed-Muller code encoder 1012.

Figure 11:
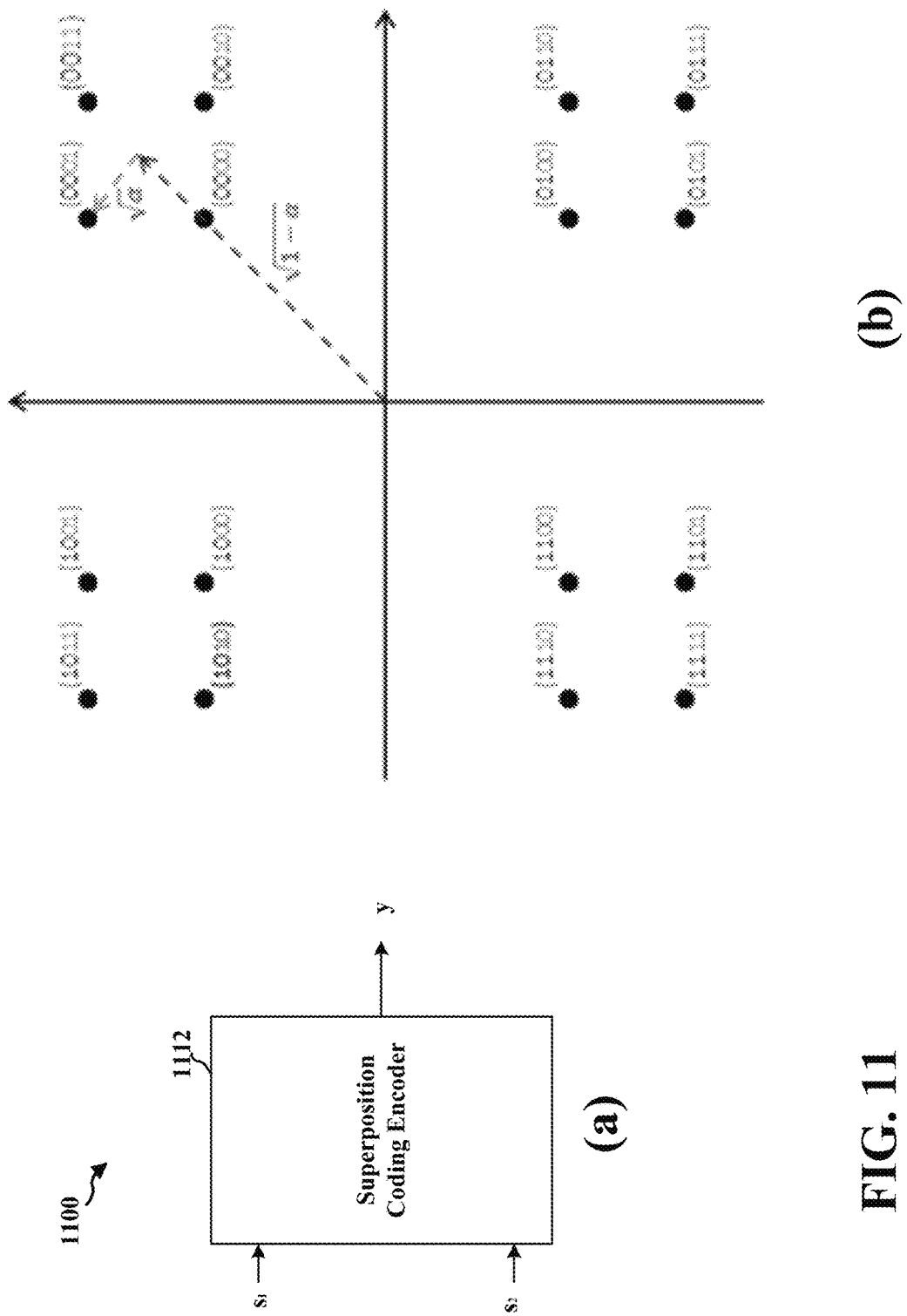
FIG. 11 is diagram illustrating a superposition coding encoder 1112 that may be employed by the UE.

FIG. 11(a) is diagram 1100 illustrating a superposition coding encoder 1112 that may be employed by the UE 104. The superposition coding encoder 1112 can receive an input bit stream $s_1$ and an input bit stream $s_2$ and generates encoded bits y.

FIG. 11(b) is diagram 1150 illustrating constellation points of the encoded bits y generated by the superposition coding encoder 1112. The UE 104 may send a first QPSK signal with Gray-mapping through the input bit stream $s_1$ and send a second QPSK signal with Gray-mapping through the input bit stream $s_2$. The first two most significant bits (MSBs) of each constellation point carry bits from the input bit stream $s_1$. The rest two bits of each constellation point carry bits from the input bit stream $s_2$. The two MSBs have higher reliability than the other two bits. Distance among the constellation points is determined by the amount of power allocated to the signals of the input bit stream $s_2$ and the signals from the input bit stream $s_1$. In FIG. 11(b), the power ratio of a signal of the input bit stream $s_2$ to total power is α. The UE 104 can allocate more power to signals from the input bit stream $s_1$.

In one example, the message 812-1 has 36 bits carrying the first PMI i1 and the message 812-2 has 36 bits carrying the second PMI i2. The bits of the message 812-1 may be sent to the superposition coding encoder 1112 through the input bit stream $s_1$, and the bits of the message 812-2 may be sent to the superposition coding encoder 1112 through the input bit stream $s_2$. The superposition coding encoder 1112 can sequentially map two bits from the input bit stream $s_1$ and two bits from the input bit stream $s_2$ to a uniform/non-uniform 16-QAM symbol (as illustrated in FIG. 11(b)), which carries 4-bit information, for transmission. The superposition coding encoder 1112 generates 18 16-QAM symbols to transmit the message 812-1 and the message 812-2. For each 16-QAM symbol, the two MSBs are decoded to recover bits of the message 812-1, and the other two bits are decoded to recover bits of the message 812-2.

The UE 104 may use the techniques described supra to multiplex some or all messages containing RI, CQI, and/or PMI. The UE 104 may also use the techniques described supra to multiplex a first PMI i1 and a second PMI i2 defined in 3GPP Release 10, 3GPP Release 13/14, and/or 3GPP NR Release 15. Note when a 2-dimensional (2D) antenna array is used at the base station 102, the first PMI i1 may have two or three parts, including one part for beam selection at dimension 1 and another part for beam selection at dimension 2. In NR, first PMI i1 may have three parts, one part $i_{1,1}$ for beam selection at dimension 1, one part $i_{1,2}$ for beam selection at dimension 2, and another part $i_{1,3}$ for orthogonal beam group selection. In certain circumstances, the UE 104 can absorb the part $i_{1,3}$ into the part $i_{1,1}$ or the part $i_{1,2}$.

In certain configurations, the UE 104 can quantize explicit CSI messages such as a channel covariance matrix, a channel eigenvector, or a channel measurement to finite bits for feedback. In general, the UE 104 may use a basis of vectors/matrices and a set of coefficients to describe how to perform the linear combination. For example, a channel matrix M could be expressed as $$M = c_1 B_1 + c_2 B_2 + \ldots + c_m B_m = \Sigma_{i=1}^{m} c_i B_i,$$

where $c_i$ is complex-valued; $\{B_i\}$ are predefined basis matrices configured at the base station 102 or $\{B_i\}$ is signaled to the base station 102 by the UE 104. For example, the UE 104 may use the first PMI i1 as an indicator for identifying the matrices $\{B_i\}$. The complex-valued coefficients $c_1, c_2, \ldots, c_m$ may be quantized for feedback in terms of the amplitude and the phase of the coefficients. X bits to represent the amplitude of $c_i$ and Y bits to represent the phase of $c_i$. Accordingly, $$|c_i| \approx \frac{1}{\beta} \sum_{i=1}^{X} b_i 2^{i-1}$$

with a scaling factor β and binary bits $b_i$. The UE 104 may be configured to treat the MSBs representing the quantized amplitude or phase as the most important and to determine that those MSBs require better protection for feedback. The UE 104 may treat $b_i$ as having priority levels in a descending order and use the Polar code encoder 912, the Reed-Muller code encoder 1012, or the superposition coding encoder 1112 to transmit the $b_i$ to the base station 102 as described supra.

In NR Type 1, the CSI feedback may include a first PMI i1, which may contain one part $i_{1,1}$, one part $i_{1,2}$, and one part $i_{1,3}$. The PMI i1 describes how to select a group of beams as well as how to select a single beam direction or multiple beam directions. The CSI feedback may include a second PMI i2, which describes how to select one beam direction from a group of beam candidates and co-phasing between two set of antennas for two polarizations. The CSI feedback may also include Wide-band (WB) CQI, Sub-band (SB) CQI, WB inter-panel co-phasing, and/or SB inter-panel co-phasing.

In NR Type 2, the CSI feedback may include a WB L-beam selection, which indicates the L beams out of multiple beam candidates for linear combination, L being an integer. The CSI feedback may include WB index for the strongest coefficient per layer. The CSI feedback may also include WB amplitude, WB phase (for the case with WB-only amplitude), SB amplitude, SB amplitude for first K strongest coefficients, SB phase for first K strongest coefficients, SB phase for remaining (2L-K) coefficients, WB CQI, and/or SB CQI.

The UE 104 may be configured with a set of rules that specifies priority levels of different messages to be transmitted to the base station 102. In particular, in certain configurations, a message carrying WB CSI components has a priority level higher than that of a message carrying SB CSI components. In certain configurations, a message carrying a RI has a priority level higher than that of a message carrying a PMI. In certain configurations, a message carrying a PMI has a priority level higher than that of a message carrying a CQI. In certain configurations, a message carrying a WB PMI has a priority level higher than that of a message carrying a SB PMI. In certain configurations, a message carrying a WB CQI has a priority level higher than that of a message carrying a SB CQI. In certain configurations, a message carrying a first PMI i1 or a component of the first PMI i1 has a priority level higher than that of a message carrying a second PMI i2. In certain configurations, a message carrying an indicator of WB L-beam selection has a priority level higher than that of a message carrying an indicator of a WB index for the strongest coefficient per layer. In certain configurations, a message carrying an indicator of a WB index for the strongest coefficient per layer has a priority level higher than that of a message carrying an indicator of WB amplitude.

In certain configurations, the UE 104 may use multiple bits to represent multiple amplitudes. The multiple bits are assigned with importance in a descending order from the MSB to the least significant bit (LSB) of the multiple bits. Accordingly, priority levels of messages carrying the multiple bits descend from a message carrying a most significant bit of the multiple bits to a message carrying a least significant bit of the multiple bits. In certain configurations, as a further optimization, for L beams, the MSB bits for all beams come before the LSB bits for all beams in the descending order of importance.

In certain configurations, the UE 104 may classify SB CQIs as two groups. One group is associated with odd indexed sub-bands, and the other group is associated with even indexed sub-bands. The UE 104 may assign a message carrying a SB CQI from one group a priority level higher than that of a message carrying a SB CQI from the other group.

In certain configurations, the UE 104 may classify SB amplitude reports as two groups. One group is associated with odd indexed sub-bands and the other group is associated with even indexed sub-bands. The UE 104 may assign a message carrying a SB amplitude from one group a priority level higher than that of a message carrying a SB amplitude from the other group.

In certain configurations, a message carrying a SB phase for the first K strongest coefficients has a priority level higher than a message carrying a SB phase for remaining (2L-K) coefficients.

In certain configurations, the UE 104 divides CSI information into two groups: group 1 which consists of L1 bits and group 2 which consists of L2 bits. Further, group 1 is protected with a CRC (CRC1) or a channel code in general (e.g., Hamming code or Reed-Muller code). The resulted codeword (which has L1+Lp bits, Lp being the additional bits due to the channel code or CRC) is concatenated with group 2. Subsequently, the UE 104 applies Polar code to the L1+Lp+L2 bits such that the first L1+Lp bits are better protected.

On the network side, in the case the base station 102 is not able to receive the entire CSI information including the group 1 and the group 2, the base station 102 may still be able to receive the information from the group 1. As a CRC or channel code is applied to the L1 bits in the group 1, the resulted L1+Lp bits have an algebraic structure that allows the network to determine whether the received L1+Lp bits (ultimately the L1 bits for group 1) are correct.

Figure 12:
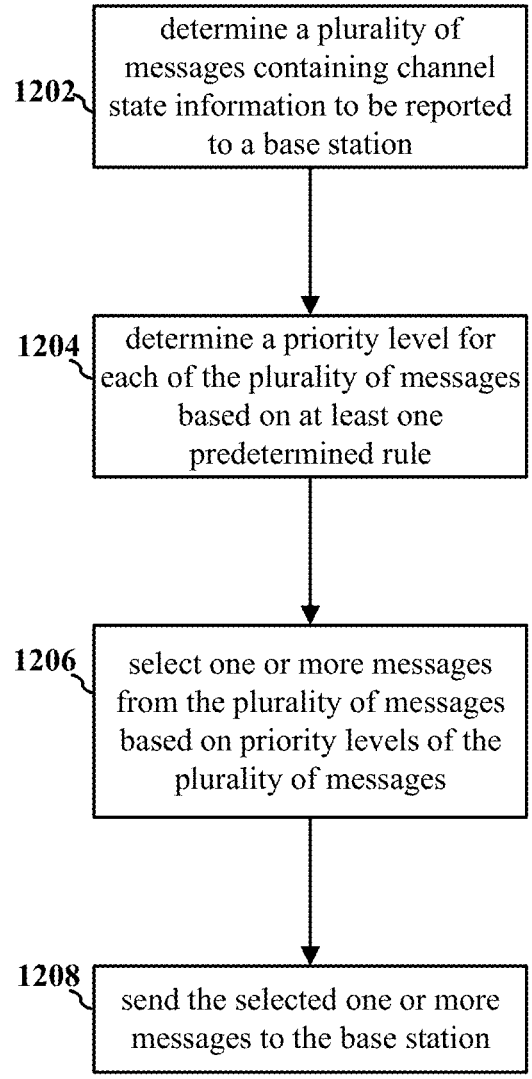
FIG. 12 is a flow of a method (process) for reporting messages to a base station.

FIG. 12 is a flow chart 1200 of a method (process) for reporting messages to a base station. The method may be performed by a UE (e.g., the UE 104, the UE 350, the apparatus 1402'). At operation 1202, the UE determines a plurality of messages containing channel state information to be reported to a base station. At operation 1204, the UE determines a priority level for each of the plurality of messages based on at least one predetermined rule. At operation 1206, the UE selects one or more messages from the plurality of messages based on priority levels of the plurality of messages. At operation 1208, the UE sends the selected one or more messages to the base station.

In certain configurations, the channel state information contains wide-band channel state information and sub-band channel state information. In certain configurations, the channel state information contains at least one of a channel quality indicator, a rank indication, and a precoding matrix indicator. In certain configurations, the at least one predetermined rule specifies that a message including a wide-band component of the channel state information has a priority level higher than a priority level of a message including a sub-band component of the channel state information.

In certain configurations, the at least one predetermined rule specifies that a message including a rank indication has a priority level higher than a priority level of a message including a channel quality indicator. In certain configurations, the at least one predetermined rule specifies that a message including a rank indication has a priority level higher than a priority level of a message including a precoding matrix indicator. In certain configurations, the at least one predetermined rule specifies that a message including a precoding matrix indicator has a priority level higher than a priority level of a message including a channel quality indicator.

In certain configurations, the at least one predetermined rule specifies that a message including an indicator indicating at least one of a beam selection at a particular dimension and an orthogonal beam group selection has a priority level higher than a priority level of a message including an indicator indicating at least one of a beam direction from a group of beam candidates or co-phasing between two sets of antennas for two polarizations.

In certain configurations, the at least one predetermined rule specifies that a message including an indicator indicating a number of beams for a linear combination has a priority level higher than a priority level of a message including an indicator indicating an index for a strongest coefficient per layer.

In certain configurations, the at least one predetermined rule specifies that a priority level of a message including an indicator indicating an index for a strongest coefficient per layer has a priority level higher than a priority level of a message including an indicator indicating a wide-band amplitude.

In certain configurations, the at least one predetermined rule specifies that, for reporting a plurality of bits representing amplitudes, priority levels of messages carrying the plurality of bits descend from a message carrying a most significant bit of the plurality of bits to a message carrying a least significant bit of the plurality of bits.

In certain configurations, the at least one predetermined rule specifies that, for reporting channel state information of a plurality of sub-band channels, all messages carrying channel state information of odd indexed sub-band channels of the plurality of sub-band channels have priority levels higher or lower than priority levels of all messages carrying channel state information of even indexed sub-band channels of the plurality of sub-band channels.

In certain configurations, the at least one predetermined rule specifies that, for reporting a plurality of sub-band amplitudes, all messages carrying odd indexed sub-band amplitudes of the plurality of sub-band amplitudes have priority levels higher or lower than priority levels of all messages carrying even indexed sub-band amplitude of the plurality of sub-band amplitudes.

In certain configurations, the at least one predetermined rule specifies that, for reporting a plurality of sub-band phases, messages carrying sub-band phases of the plurality of sub-band phases associated with a number of strongest coefficients have priority levels higher than priority levels of messages carrying the remaining sub-band phases of the plurality of sub-band phases.

Figure 13:
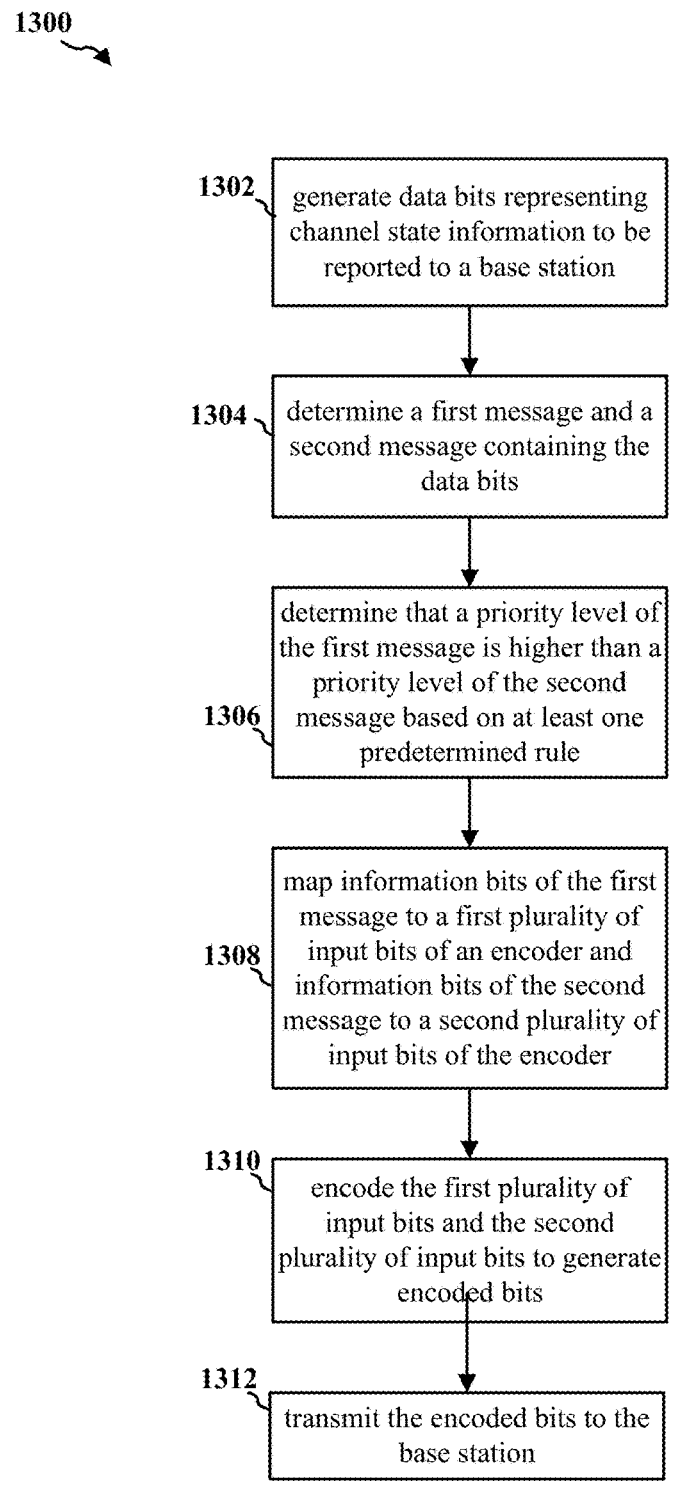
FIG. 13 is a flow chart of a method (process) for encoding messages.

FIG. 13 is a flow chart 1300 of a method (process) for encoding messages. The method may be performed by a UE (e.g., the UE 104, the UE 350, the apparatus 1402'). At operation 1302, the UE generates data bits representing channel state information to be reported to a base station. At operation 1304, the UE determining a first message and a second message containing the data bits. In certain configurations, information bits of the first message include a first group of data bits of the generated data bits and protection bits derived from the first group of data bits. Information bits of the second message include a second group of data bits of the generated data bits.

At operation 1306, the UE determines that a priority level of the first message is higher than a priority level of the second message based on at least one predetermined rule. At operation 1308, the UE maps information bits of the first message to a first plurality of input bits of an encoder and information bits of the second message to a second plurality of input bits of the encoder. The first plurality of input bits offer an error protection level higher than an error protection level offered by the second plurality of input bits. At operation 1310, the UE encodes the first plurality of input bits and the second plurality of input bits to generate encoded bits. At operation 1312, the UE transmits the encoded bits to the base station.

In certain configurations, the encoder is one of a Polar-code encoder, a Reed-Muller encoder, and a super-position coding encoder. In certain configurations, where the encoder is the Polar-code encoder, reliabilities of the first plurality of input bits are higher than reliabilities of the second plurality of input bits. A reliability of each input bit of the first plurality of input bits and the second plurality of input bits is defined by a correct rate or a log likelihood ratio (LLR) of that input bit.

In certain configurations, where the encoder is the Reed-Muller encoder, the first plurality of input bits are carried by a first set of basis vectors. The second plurality of input bits are carried by a second set of basis vectors. A minimum Euclidean distance of any basis vector in the first set of basis vectors with respect to the other basis vectors in the first set of basis vectors is greater than or equal to a minimum Euclidean distance of any basis vector in the second set of basis vectors with respect to the other basis vectors in the second set of basis vectors.

In certain configurations, where the encoder is the super-position coding encoder, the first plurality of input bits are a predetermined number of most significant bits of one or more symbols. The second plurality of input bits are among the other bits of the one or more symbols.

In certain configurations, the protection bits are a cyclic redundancy check computed based on the first group of data bits or a channel code computed based on the first group of data bits.

In certain configurations, the channel state information contains wide-band channel state information and sub-band channel state information. In certain configurations, the channel state information contains at least one of a channel quality indicator, a rank indication, and a precoding matrix indicator. In certain configurations, the at least one predetermined rule specifies that a message including a wide-band component of the channel state information has a priority level higher than a priority level of a message including a sub-band component of the channel state information.

In certain configurations, the at least one predetermined rule specifies that a message including a rank indication has a priority level higher than a priority level of a message including a channel quality indicator. In certain configurations, the at least one predetermined rule specifies that a message including a rank indication has a priority level higher than a priority level of a message including a precoding matrix indicator. In certain configurations, the at least one predetermined rule specifies that a message including a precoding matrix indicator has a priority level higher than a priority level of a message including a channel quality indicator.

In certain configurations, the at least one predetermined rule specifies that a message including an indicator indicating at least one of a beam selection at a particular dimension and an orthogonal beam group selection has a priority level higher than a priority level of a message including an indicator indicating at least one of a beam direction from a group of beam candidates or co-phasing between two sets of antennas for two polarizations.

In certain configurations, the at least one predetermined rule specifies that a message including an indicator indicating a number of beams for a linear combination has a priority level higher than a priority level of a message including an indicator indicating an index for a strongest coefficient per layer.

In certain configurations, the at least one predetermined rule specifies that a priority level of a message including an indicator indicating an index for a strongest coefficient per layer has a priority level higher than a priority level of a message including an indicator indicating a wide-band amplitude.

In certain configurations, the at least one predetermined rule specifies that, for reporting a plurality of bits representing amplitudes, priority levels of messages carrying the plurality of bits descend from a message carrying a most significant bit of the plurality of bits to a message carrying a least significant bit of the plurality of bits.

In certain configurations, the at least one predetermined rule specifies that, for reporting channel state information of a plurality of sub-band channels, all messages carrying channel state information of odd indexed sub-band channels of the plurality of sub-band channels have priority levels higher or lower than priority levels of all messages carrying channel state information of even indexed sub-band channels of the plurality of sub-band channels.

In certain configurations, the at least one predetermined rule specifies that, for reporting a plurality of sub-band amplitudes, all messages carrying odd indexed sub-band amplitudes of the plurality of sub-band amplitudes have priority levels higher or lower than priority levels of all messages carrying even indexed sub-band amplitude of the plurality of sub-band amplitudes.

In certain configurations, the at least one predetermined rule specifies that, for reporting a plurality of sub-band phases, messages carrying sub-band phases of the plurality of sub-band phases associated with a number of strongest coefficients have priority levels higher than priority levels of messages carrying the remaining sub-band phases of the plurality of sub-band phases.

Figure 14:
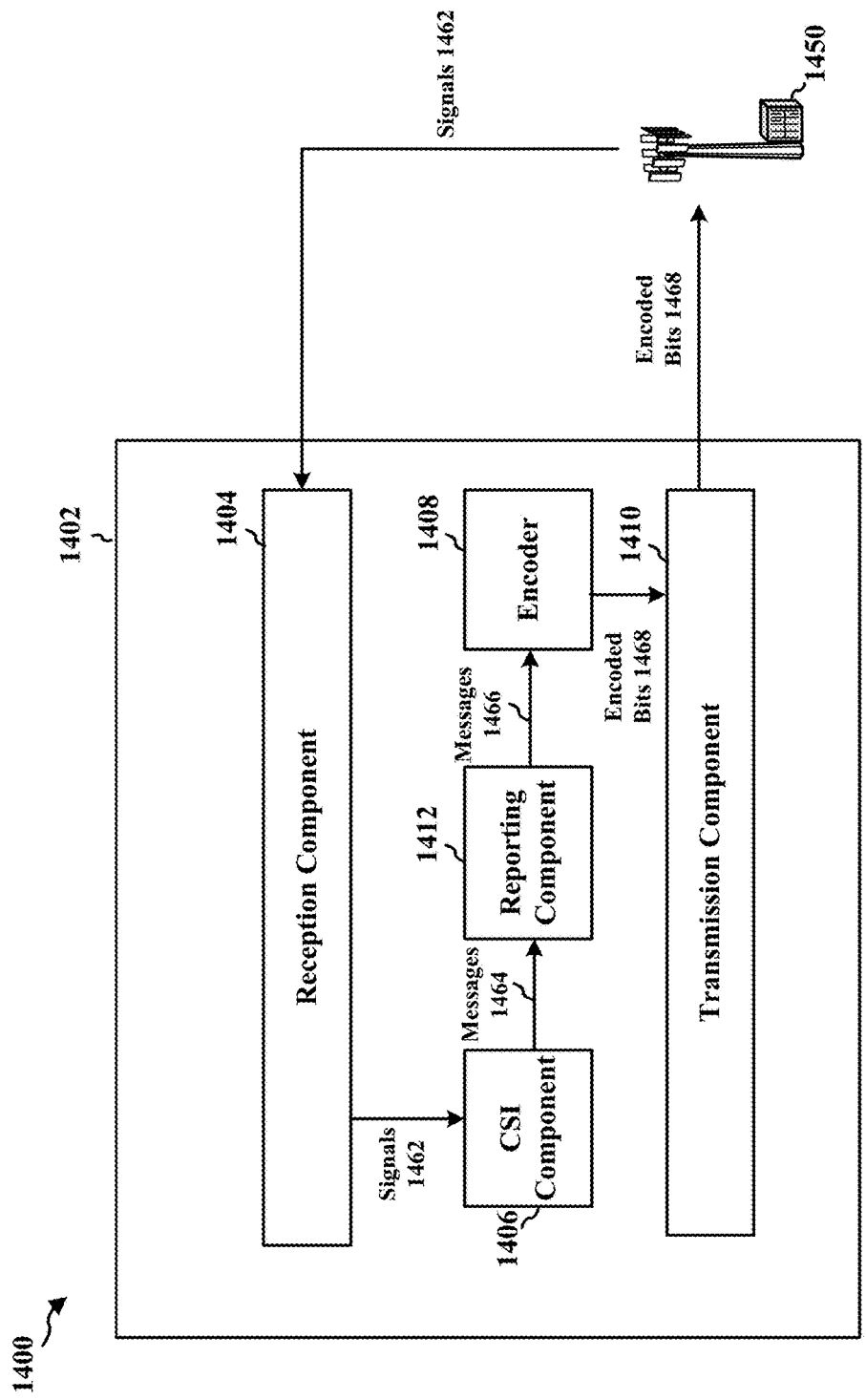
FIG. 14 is a conceptual data flow diagram illustrating the data flow between different components/means in an exemplary apparatus.

FIG. 14 is a conceptual data flow diagram 1400 illustrating the data flow between different components/means in an exemplary apparatus 1402. The apparatus 1402 may be a UE. The apparatus 1402 includes a reception component 1404, a CSI component 1406, an encoder 1408, a reporting component 1412, and a transmission component 1410. The transmission component 1410 may receive signals 1462 (e.g., reference signals) from a base station 1450.

In one aspect, the reception component 1404 sends the signals 1462 to the CSI component 1406. Based on the signals 1462, the CSI component 1406 determines a plurality of messages 1464 containing channel state information to be reported to the base station 1450. The CSI component 1406 sends the plurality of messages 1464 to the reporting component 1412. The reporting component 1412 determines a priority level for each of the plurality of messages 1464 based on at least one predetermined rule. The reporting component 1412 selects one or more messages 1466 from the plurality of messages 1464 based on priority levels of the plurality of messages. The reporting component 1412 sends the selected one or more messages 1466 to the encoder 1408. The encoder 1408 generates encoded bits 1468 for the messages 1466. The encoder 1408 sends the encoded bits 1468 to the transmission component 1410. The transmission component 1410 then transmits the encoded bits 1468 (representing the messages 1466) to the base station 1450.

In another aspect, the reception component 1404 sends the signals 1462 to the CSI component 1406. Based on the signals 1462, the CSI component 1406 generates data bits representing channel state information to be reported to the base station 1450. The CSI component 1406 determining a first message and a second message containing the data bits. In certain configurations, information bits of the first message include a first group of data bits of the generated data bits and protection bits derived from the first group of data bits. Information bits of the second message include a second group of data bits of the generated data bits. The CSI component 1406 sends the first message and the second message to the reporting component 1412.

The reporting component 1412 determines that a priority level of the first message is higher than a priority level of the second message based on at least one predetermined rule. The reporting component 1412 maps information bits of the first message to a first plurality of input bits of the encoder 1408 and information bits of the second message to a second plurality of input bits of the encoder 1408. The first plurality of input bits offer an error protection level higher than an error protection level offered by the second plurality of input bits.

The encoder 1408 encodes the first plurality of input bits and the second plurality of input bits to generate the encoded bits 1468. The encoder 1408 sends the encoded bits 1468 to the transmission component 1410. The transmission component 1410 then transmits the encoded bits 1468 (representing the first and second messages) to the base station 1450.

In certain configurations, the encoder 1408 is one of a Polar-code encoder, a Reed-Muller encoder, and a super-position coding encoder. In certain configurations, where the encoder 1408 is the Polar-code encoder, reliabilities of the first plurality of input bits are higher than reliabilities of the second plurality of input bits. A reliability of each input bit of the first plurality of input bits and the second plurality of input bits is defined by a correct rate or a LLR of that input bit.

In certain configurations, where the encoder 1408 is the Reed-Muller encoder, the first plurality of input bits are carried by a first set of basis vectors. The second plurality of input bits are carried by a second set of basis vectors. A minimum Euclidean distance of any basis vector in the first set of basis vectors with respect to the other basis vectors in the first set of basis vectors is greater than or equal to a minimum Euclidean distance of any basis vector in the second set of basis vectors with respect to the other basis vectors in the second set of basis vectors.

In certain configurations, where the encoder 1408 is the super-position coding encoder, the first plurality of input bits are a predetermined number of most significant bits of one or more symbols. The second plurality of input bits are among the other bits of the one or more symbols.

In certain configurations, the protection bits are a cyclic redundancy check computed based on the first group of data bits or a channel code computed based on the first group of data bits.

In certain configurations, the channel state information contains wide-band channel state information and sub-band channel state information. In certain configurations, the channel state information contains at least one of a channel quality indicator, a rank indication, and a precoding matrix indicator. In certain configurations, the at least one predetermined rule specifies that a message including a wide-band component of the channel state information has a priority level higher than a priority level of a message including a sub-band component of the channel state information.

In certain configurations, the at least one predetermined rule specifies that a message including a rank indication has a priority level higher than a priority level of a message including a channel quality indicator. In certain configurations, the at least one predetermined rule specifies that a message including a rank indication has a priority level higher than a priority level of a message including a precoding matrix indicator. In certain configurations, the at least one predetermined rule specifies that a message including a precoding matrix indicator has a priority level higher than a priority level of a message including a channel quality indicator.

In certain configurations, the at least one predetermined rule specifies that a message including an indicator indicating at least one of a beam selection at a particular dimension and an orthogonal beam group selection has a priority level higher than a priority level of a message including an indicator indicating at least one of a beam direction from a group of beam candidates or co-phasing between two sets of antennas for two polarizations.

In certain configurations, the at least one predetermined rule specifies that a message including an indicator indicating a number of beams for a linear combination has a priority level higher than a priority level of a message including an indicator indicating an index for a strongest coefficient per layer.

In certain configurations, the at least one predetermined rule specifies that a priority level of a message including an indicator indicating an index for a strongest coefficient per layer has a priority level higher than a priority level of a message including an indicator indicating a wide-band amplitude.

In certain configurations, the at least one predetermined rule specifies that, for reporting a plurality of bits representing amplitudes, priority levels of messages carrying the plurality of bits descend from a message carrying a most significant bit of the plurality of bits to a message carrying a least significant bit of the plurality of bits.

In certain configurations, the at least one predetermined rule specifies that, for reporting channel state information of a plurality of sub-band channels, all messages carrying channel state information of odd indexed sub-band channels of the plurality of sub-band channels have priority levels higher or lower than priority levels of all messages carrying channel state information of even indexed sub-band channels of the plurality of sub-band channels.

In certain configurations, the at least one predetermined rule specifies that, for reporting a plurality of sub-band amplitudes, all messages carrying odd indexed sub-band amplitudes of the plurality of sub-band amplitudes have priority levels higher or lower than priority levels of all messages carrying even indexed sub-band amplitude of the plurality of sub-band amplitudes.

In certain configurations, the at least one predetermined rule specifies that, for reporting a plurality of sub-band phases, messages carrying sub-band phases of the plurality of sub-band phases associated with a number of strongest coefficients have priority levels higher than priority levels of messages carrying the remaining sub-band phases of the plurality of sub-band phases.

Figure 15:
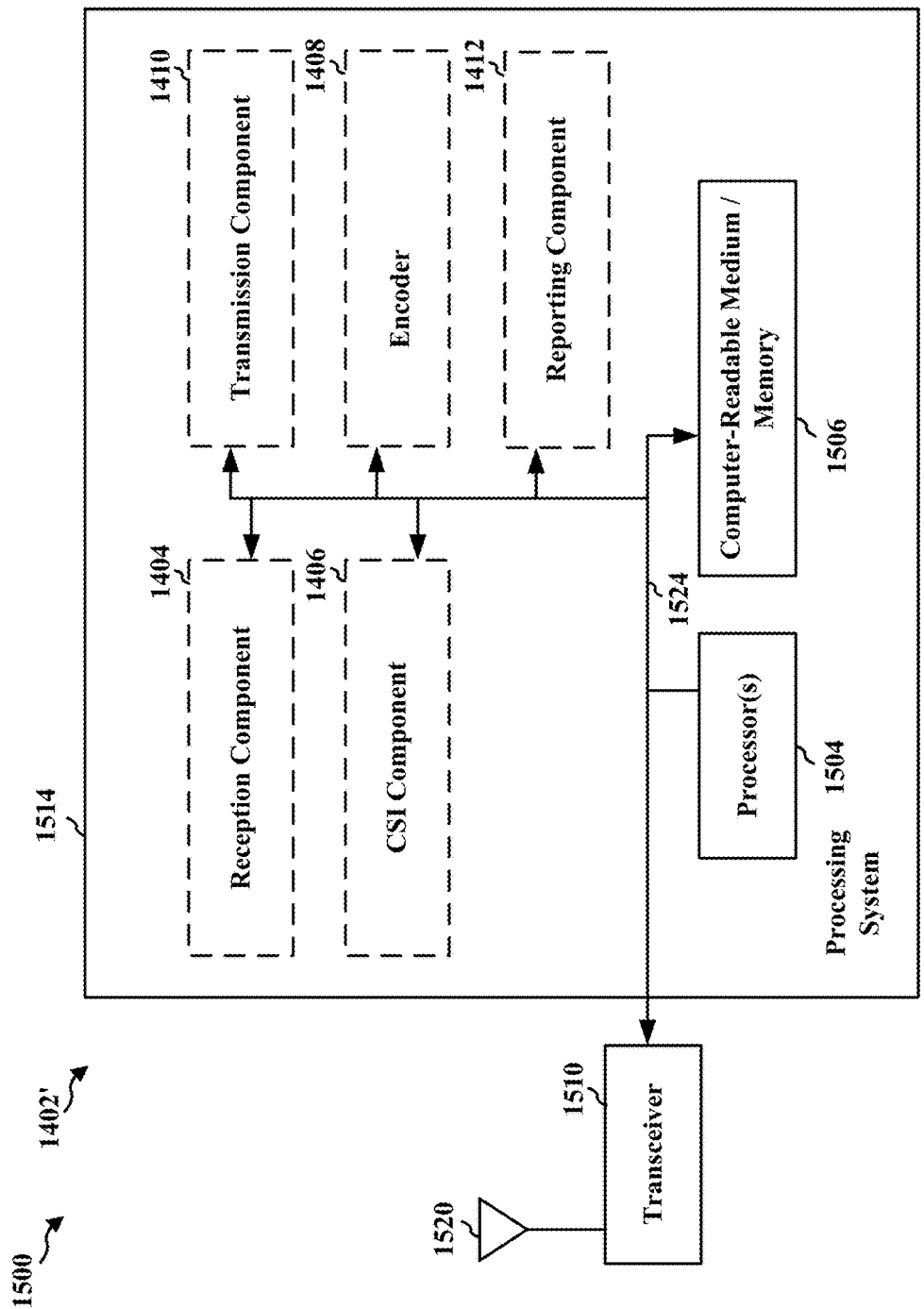
FIG. 15 is a diagram illustrating an example of a hardware implementation for an apparatus employing a processing system.

FIG. 15 is a diagram 1500 illustrating an example of a hardware implementation for an apparatus 1402' employing a processing system 1514. The processing system 1514 may be implemented with a bus architecture, represented generally by a bus 1524. The bus 1524 may include any number of interconnecting buses and bridges depending on the specific application of the processing system 1514 and the overall design constraints. The bus 1524 links together various circuits including one or more processors and/or hardware components, represented by one or more processors 1504, the reception component 1404, the CSI component 1406, the encoder 1408, the transmission component 1410, and the reporting component 1412, and a computer-readable medium/memory 1506. The bus 1524 may also link various other circuits such as timing sources, peripherals, voltage regulators, and power management circuits, etc.

The processing system 1514 may be coupled to a transceiver 1510, which may be one or more of the transceivers 354. The transceiver 1510 is coupled to one or more antennas 1520, which may be the communication antennas 352.

The transceiver 1510 provides a means for communicating with various other apparatus over a transmission medium. The transceiver 1510 receives a signal from the one or more antennas 1520, extracts information from the received signal, and provides the extracted information to the processing system 1514, specifically the reception component 1404. In addition, the transceiver 1510 receives information from the processing system 1514, specifically the transmission component 1410, and based on the received information, generates a signal to be applied to the one or more antennas 1520.

The processing system 1514 includes one or more processors 1504 coupled to a computer-readable medium/memory 1506. The one or more processors 1504 are responsible for general processing, including the execution of software stored on the computer-readable medium/memory 1506. The software, when executed by the one or more processors 1504, causes the processing system 1514 to perform the various functions described supra for any particular apparatus. The computer-readable medium/memory 1506 may also be used for storing data that is manipulated by the one or more processors 1504 when executing software. The processing system 1514 further includes at least one of the reception component 1404, the CSI component 1406, the encoder 1408, the transmission component 1410, and the reporting component 1412. The components may be software components running in the one or more processors 1504, resident/stored in the computer readable medium/memory 1506, one or more hardware components coupled to the one or more processors 1504, or some combination thereof. The processing system 1514 may be a component of the UE 350 and may include the memory 360 and/or at least one of the TX processor 368, the RX processor 356, and the communication processor 359.

In one configuration, the apparatus 1402/apparatus 1402' for wireless communication includes means for performing each of the operations of FIGS. 12-13. The aforementioned means may be one or more of the aforementioned components of the apparatus 1402 and/or the processing system 1514 of the apparatus 1402' configured to perform the functions recited by the aforementioned means. As described supra, the processing system 1514 may include the TX Processor 368, the RX Processor 356, and the communication processor 359. As such, in one configuration, the aforementioned means may be the TX Processor 368, the RX Processor 356, and the communication processor 359 configured to perform the functions recited by the aforementioned means.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of wireless communication of a user equipment (UE), comprising:
   determining a plurality of messages containing channel state information to be reported to a base station;
   determining a priority level for each of the plurality of messages based on at least one predetermined rule;
   selecting one or more messages from the plurality of messages based on priority levels of the plurality of messages; and
   sending the selected one or more messages to the base station;
   wherein the at least one predetermined rule specifies that a message including an indicator indicating at least one of a beam selection at a particular dimension and an orthogonal beam group selection has a priority level higher than a priority level of a message including an indicator indicating at least one of a beam direction from a group of beam candidates or co-phasing between two sets of antennas for two polarizations.

2. The method of claim 1, wherein the channel state information contains wide-band channel state information and sub-band channel state information.

3. The method of claim 1, wherein the channel state information contains at least one of a channel quality indicator, a rank indication, and a precoding matrix indicator.

4. The method of claim 1, wherein the at least one predetermined rule specifies that a message including a wide-band component of the channel state information has a priority level higher than a priority level of a message including a sub-band component of the channel state information.

5. The method of claim 1, wherein the at least one predetermined rule specifies that a message including a rank indication has a priority level higher than a priority level of a message including a channel quality indicator.

6. The method of claim 1, wherein the at least one predetermined rule specifies that a message including a rank indication has a priority level higher than a priority level of a message including a precoding matrix indicator.

7. The method of claim 1, wherein the at least one predetermined rule specifies that a message including a precoding matrix indicator has a priority level higher than a priority level of a message including a channel quality indicator.

8. A method of wireless communication of a user equipment (UE), comprising:
   determining a plurality of messages containing channel state information to be reported to a base station;
   determining a priority level for each of the plurality of messages based on at least one predetermined rule;
   selecting one or more messages from the plurality of messages based on priority levels of the plurality of messages; and
   sending the selected one or more messages to the base station;
   wherein the at least one predetermined rule specifies that a message including an indicator indicating a number of beams for a linear combination has a priority level higher than a priority level of a message including an indicator indicating an index for a strongest coefficient per layer.

9. A method of wireless communication of a user equipment (UE), comprising:
   determining a plurality of messages containing channel state information to be reported to a base station;
   determining a priority level for each of the plurality of messages based on at least one predetermined rule;
   selecting one or more messages from the plurality of messages based on priority levels of the plurality of messages; and
   sending the selected one or more messages to the base station;
   wherein the at least one predetermined rule specifies that a priority level of a message including an indicator indicating an index for a strongest coefficient per layer has a priority level higher than a priority level of a message including an indicator indicating a wide-band amplitude.

10. A method of wireless communication of a user equipment (UE), comprising:
    determining a plurality of messages containing channel state information to be reported to a base station;
    determining a priority level for each of the plurality of messages based on at least one predetermined rule;
    selecting one or more messages from the plurality of messages based on priority levels of the plurality of messages; and
    sending the selected one or more messages to the base station;
    wherein the at least one predetermined rule specifies that, for reporting a plurality of bits representing amplitudes, priority levels of messages carrying the plurality of bits descend from a message carrying a most significant bit of the plurality of bits to a message carrying a least significant bit of the plurality of bits.

11. A method of wireless communication of a user equipment (UE), comprising:

determining a plurality of messages containing channel state information to be reported to a base station;

determining a priority level for each of the plurality of messages based on at least one predetermined rule;

selecting one or more messages from the plurality of messages based on priority levels of the plurality of messages; and sending the selected one or more messages to the base station;

wherein the at least one predetermined rule specifies that, for reporting channel state information of a plurality of sub-band channels, all messages carrying channel state information of odd indexed sub-band channels of the plurality of sub-band channels have priority levels higher or lower than priority levels of all messages carrying channel state information of even indexed sub-band channels of the plurality of sub-band channels.

12. A method of wireless communication of a user equipment (UE), comprising:

determining a plurality of messages containing channel state information to be reported to a base station;

determining a priority level for each of the plurality of messages based on at least one predetermined rule;

selecting one or more messages from the plurality of messages based on priority levels of the plurality of messages; and sending the selected one or more messages to the base station;

wherein the at least one predetermined rule specifies that, for reporting a plurality of sub-band amplitudes, all messages carrying odd indexed sub-band amplitudes of the plurality of sub-band amplitudes have priority levels higher or lower than priority levels of all messages carrying even indexed sub-band amplitude of the plurality of sub-band amplitudes.

13. A method of wireless communication of a user equipment (UE), comprising:

determining a plurality of messages containing channel state information to be reported to a base station;

determining a priority level for each of the plurality of messages based on at least one predetermined rule;

selecting one or more messages from the plurality of messages based on priority levels of the plurality of messages; and sending the selected one or more messages to the base station;

wherein the at least one predetermined rule specifies that, for reporting a plurality of sub-band phases, messages carrying sub-band phases of the plurality of sub-band phases associated with a number of strongest coefficients have priority levels higher than priority levels of messages carrying the remaining sub-band phases of the plurality of sub-band phases.

14. A method of wireless communication of a user equipment (UE), comprising:

determining a first message and a second message containing channel state information to be reported to a base station;

determining that a priority level of the first message is higher than a priority level of the second message based on at least one predetermined rule; and mapping information bits of the first message to a first plurality of input bits of an encoder and information bits of the second message to a second plurality of input bits of the encoder, the first plurality of input bits offering an error protection level higher than an error protection level offered by the second plurality of input bits;

wherein, when the encoder is the Polar-code encoder, reliabilities of the first plurality of input bits are higher than reliabilities of the second plurality of input bits, and a reliability of each input bit of the first plurality of input bits and the second plurality of input bits is defined by a correct rate or a log likelihood ratio (LLR) of that input bit.

15. The method of claim 14, further comprising:

encoding, at the encoder, the first plurality of input bits and the second plurality of input bits to generate encoded bits; and transmitting the encoded bits to the base station.

16. The method of claim 14, wherein the channel state information contains wide-band channel state information and sub-band channel state information.

17. The method of claim 14, wherein the channel state information contains at least one of a channel quality indicator, a rank indication, and a precoding matrix indicator.

18. The method of claim 14, wherein the at least one predetermined rule specifies that a message including a wide-band component of the channel state information has a priority level higher than a priority level of a message including a sub-band component of the channel state information.

19. The method of claim 14, wherein the at least one predetermined rule specifies that a message including a rank indication has a priority level higher than a priority level of a message including a channel quality indicator.

20. The method of claim 14, wherein the at least one predetermined rule specifies that a message including a rank indication has a priority level higher than a priority level of a message including a precoding matrix indicator, wherein the at least one predetermined rule further specifies that a message including a precoding matrix indicator has a priority level higher than a priority level of a message including a channel quality indicator.

21. The method of claim 14, wherein the at least one predetermined rule specifies that a message including a precoding matrix indicator has a priority level higher than a priority level of a message including a channel quality indicator.

22. The method of claim 14, wherein the at least one predetermined rule specifies that a message including an indicator indicating at least one of a beam selection at a particular dimension and an orthogonal beam group selection has a priority level higher than a priority level of a message including an indicator indicating at least one of a beam direction from a group of beam candidates or co-phasing between two sets of antennas for two polarizations.

23. The method of claim 14, wherein the at least one predetermined rule specifies that a message including an indicator indicating a number of beams for a linear combination has a priority level higher than a priority level of a message including an indicator indicating an index for a strongest coefficient per layer.

24. The method of claim 14, wherein the at least one predetermined rule specifies that a priority level of a message including an indicator indicating an index for a strongest coefficient per layer has a priority level higher than a priority level of a message including an indicator indicating a wide-band amplitude.

25. The method of claim 14, wherein the at least one predetermined rule specifies that, for reporting a plurality of bits representing amplitudes, priority levels of messages carrying the plurality of bits descend from a message carrying a most significant bit of the plurality of bits to a message carrying a least significant bit of the plurality of bits.

26. The method of claim 14, wherein the at least one predetermined rule specifies that, for reporting channel state information of a plurality of sub-band channels, all messages carrying channel state information of odd indexed sub-band channels of the plurality of sub-band channels have priority levels higher or lower than priority levels of all messages carrying channel state information of even indexed sub-band channels of the plurality of sub-band channels.

27. The method of claim 14, wherein the at least one predetermined rule specifies that, for reporting a plurality of sub-band amplitudes, all messages carrying odd indexed sub-band amplitudes of the plurality of sub-band amplitudes have priority levels higher or lower than priority levels of all messages carrying even indexed sub-band amplitude of the plurality of sub-band amplitudes.

28. The method of claim 14, wherein the at least one predetermined rule specifies that, for reporting a plurality of sub-band phases, messages carrying sub-band phases of the plurality of sub-band phases associated with a number of strongest coefficients have priority levels higher than priority levels of messages carrying the remaining sub-band phases of the plurality of sub-band phases.

29. A method of wireless communication of a user equipment (UE), comprising:
    determining a first message and a second message containing channel state information to be reported to a base station;
    determining that a priority level of the first message is higher than a priority level of the second message based on at least one predetermined rule; and
    mapping information bits of the first message to a first plurality of input bits of an encoder and information bits of the second message to a second plurality of input bits of the encoder, the first plurality of input bits offering an error protection level higher than an error protection level offered by the second plurality of input bits;
    wherein, when the encoder is the Reed-Muller encoder, the first plurality of input bits are carried by a first set of basis vectors, the second plurality of input bits are carried by a second set of basis vectors, and a minimum Euclidean distance of any basis vector in the first set of basis vectors with respect to the other basis vectors in the first set of basis vectors is greater than or equal to a minimum Euclidean distance of any basis vector in the second set of basis vectors with respect to the other basis vectors in the second set of basis vectors.

30. A method of wireless communication of a user equipment (UE), comprising:
    determining a first message and a second message containing channel state information to be reported to a base station;
    determining that a priority level of the first message is higher than a priority level of the second message based on at least one predetermined rule; and
    mapping information bits of the first message to a first plurality of input bits of an encoder and information bits of the second message to a second plurality of input bits of the encoder, the first plurality of input bits offering an error protection level higher than an error protection level offered by the second plurality of input bits;
    wherein, when the encoder is the super-position coding encoder, the first plurality of input bits are a predetermined number of most significant bits of one or more symbols, and the second plurality of input bits are among the other bits of the one or more symbols.

31. A method of wireless communication of a user equipment (UE), comprising:
    determining a first message and a second message containing channel state information to be reported to a base station;
    determining that a priority level of the first message is higher than a priority level of the second message based on at least one predetermined rule;
    mapping information bits of the first message to a first plurality of input bits of an encoder and information bits of the second message to a second plurality of input bits of the encoder, the first plurality of input bits offering an error protection level higher than an error protection level offered by the second plurality of input bits
    encoding, at the encoder, the first plurality of input bits and the second plurality of input bits to generate encoded bits; and
    transmitting the encoded bits to the base station;
    wherein the method further comprises:
    generating data bits representing the channel state information, wherein the information bits of the first message include a first group of data bits of the generated data bits and protection bits derived from the first group of data bits, wherein the information bits of the second message include a second group of data bits of the generated data bits.

32. The method of claim 31, wherein the protection bits are a cyclic redundancy check computed based on the first group of data bits or a channel code computed based on the first group of data bits.

* * * * *